United States Patent
Okada

(10) Patent No.: US 9,349,625 B2
(45) Date of Patent: May 24, 2016

(54) SUBSTRATE CONVEYANCE METHOD AND SUBSTRATE PROCESSING APPARATUS

(71) Applicant: SCREEN Holdings Co., Ltd., Kyoto (JP)

(72) Inventor: Yoshifumi Okada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/547,346

(22) Filed: Nov. 19, 2014

(65) Prior Publication Data

US 2015/0139760 A1    May 21, 2015

(30) Foreign Application Priority Data

Nov. 21, 2013 (JP) .................................. 2013-240597
Sep. 29, 2014 (JP) .................................. 2014-198311

(51) Int. Cl.
*G06F 7/00* (2006.01)
*H01L 21/67* (2006.01)
*H01L 21/677* (2006.01)

(52) U.S. Cl.
CPC .... *H01L 21/67276* (2013.01); *H01L 21/67742* (2013.01); *H01L 21/67781* (2013.01); *G05B 2219/32283* (2013.01); *G05B 2219/45031* (2013.01); *Y02P 90/20* (2015.11)

(58) Field of Classification Search
USPC ....................................................... 700/213
See application file for complete search history.

(56) References Cited

U.S. PATENT DOCUMENTS

| 7,191,033 B2* | 3/2007 | Higashi | G03F 7/00 414/935 |
| 2002/0059015 A1* | 5/2002 | Oh | G06Q 10/06 700/213 |
| 2011/0172800 A1* | 7/2011 | Koizumi | H01L 21/67253 700/100 |

FOREIGN PATENT DOCUMENTS

| JP | 2012-199328 | 10/2012 |
| JP | 5102717 | 10/2012 |

* cited by examiner

*Primary Examiner* — Kyle Logan
(74) *Attorney, Agent, or Firm* — Ostrolenk Faber LLP

(57) ABSTRACT

Provided is a substrate conveyance method where a segment which can simultaneously hold M pieces of substrates defined by an integer M of 2 or more is provided, and a substrate conveyance part can simultaneously convey N pieces of substrates defined by an integer N of 2 or more which is not a divisor of the integer M from the segment or toward the segment. The substrate conveyance part performs a substrate conveyance cycle repeatedly where when N pieces of variables ik defined by integers k of 1 to N are arbitrary integers of 0 or more and not more than (M/N) and satisfy a relationship of M=N×i1+ . . . +1×iN, a conveyance step where a substrate conveyance step of simultaneously conveying (N−k−1) pieces of substrates from the segment or toward the segment by the substrate conveyance part is performed ik times is performed with respect to the conveyance step where the number of times of the substrate conveyance steps is defined by each variable which is a natural number out of N pieces of variables ik.

12 Claims, 19 Drawing Sheets

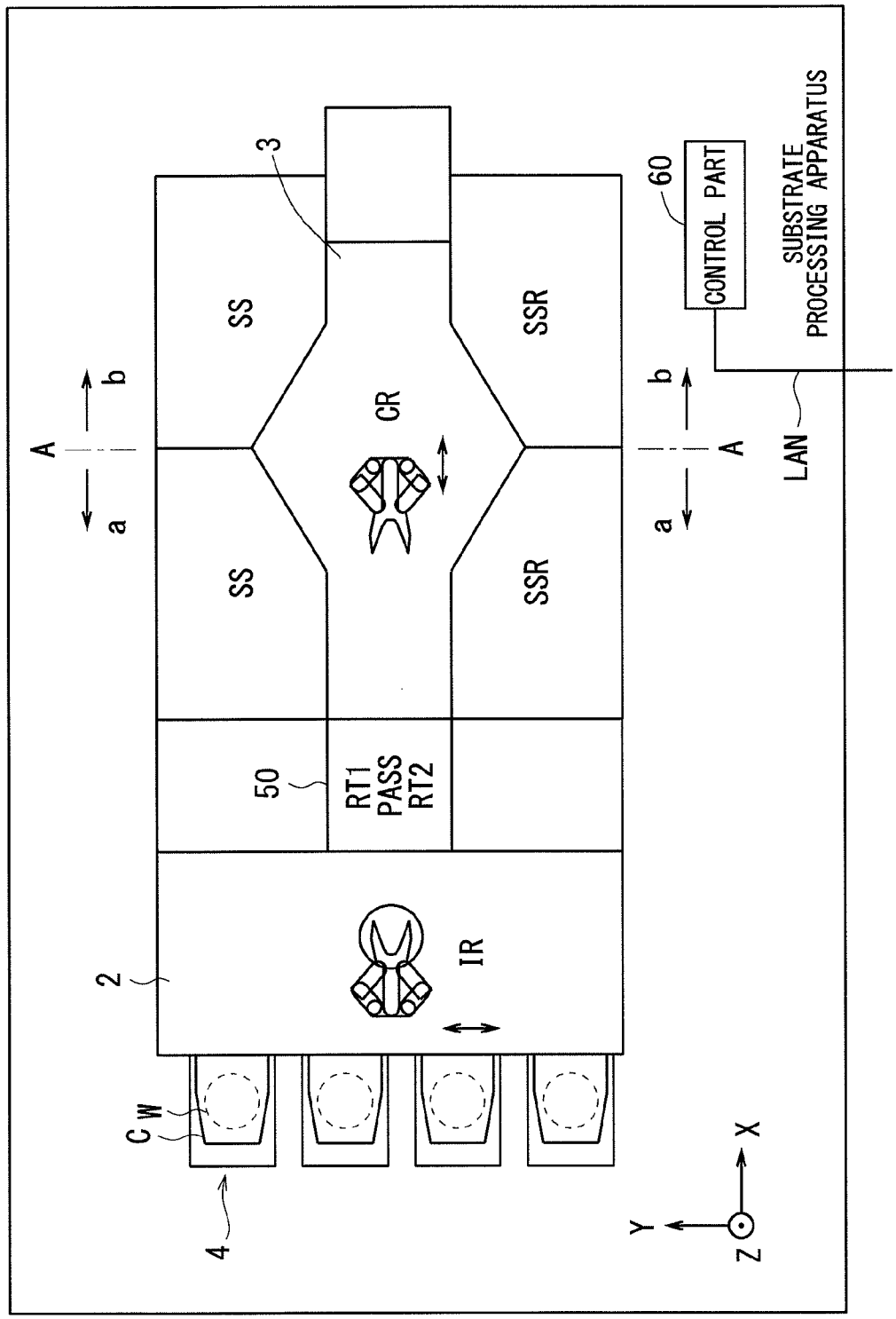
F I G. 1

F I G. 3
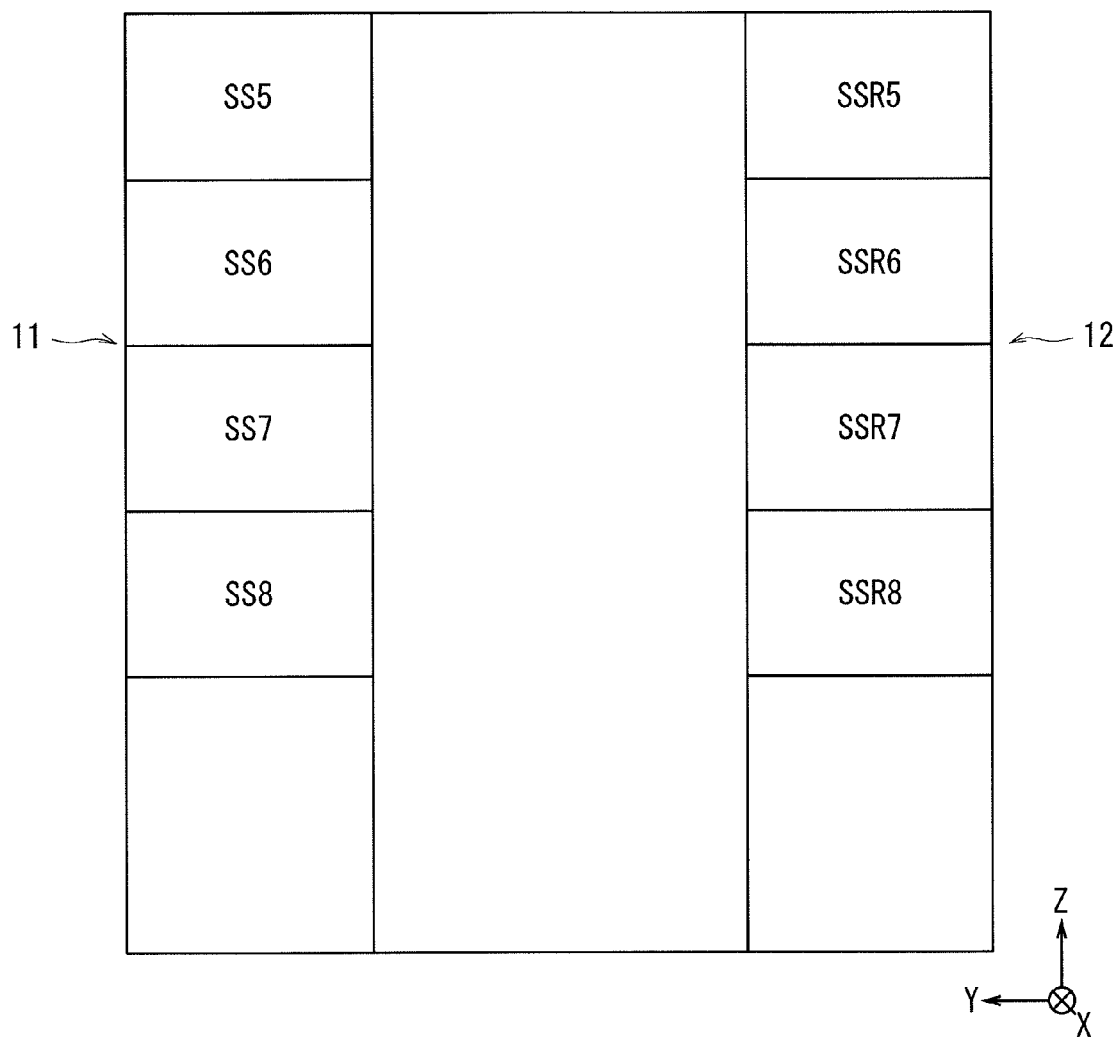

F I G. 9
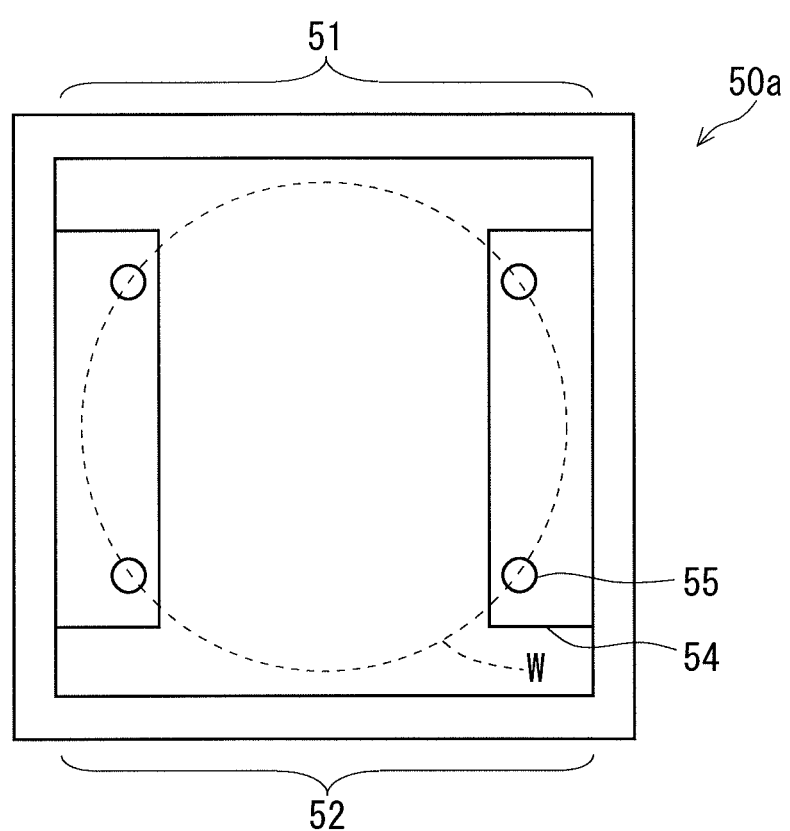

F I G. 1 1
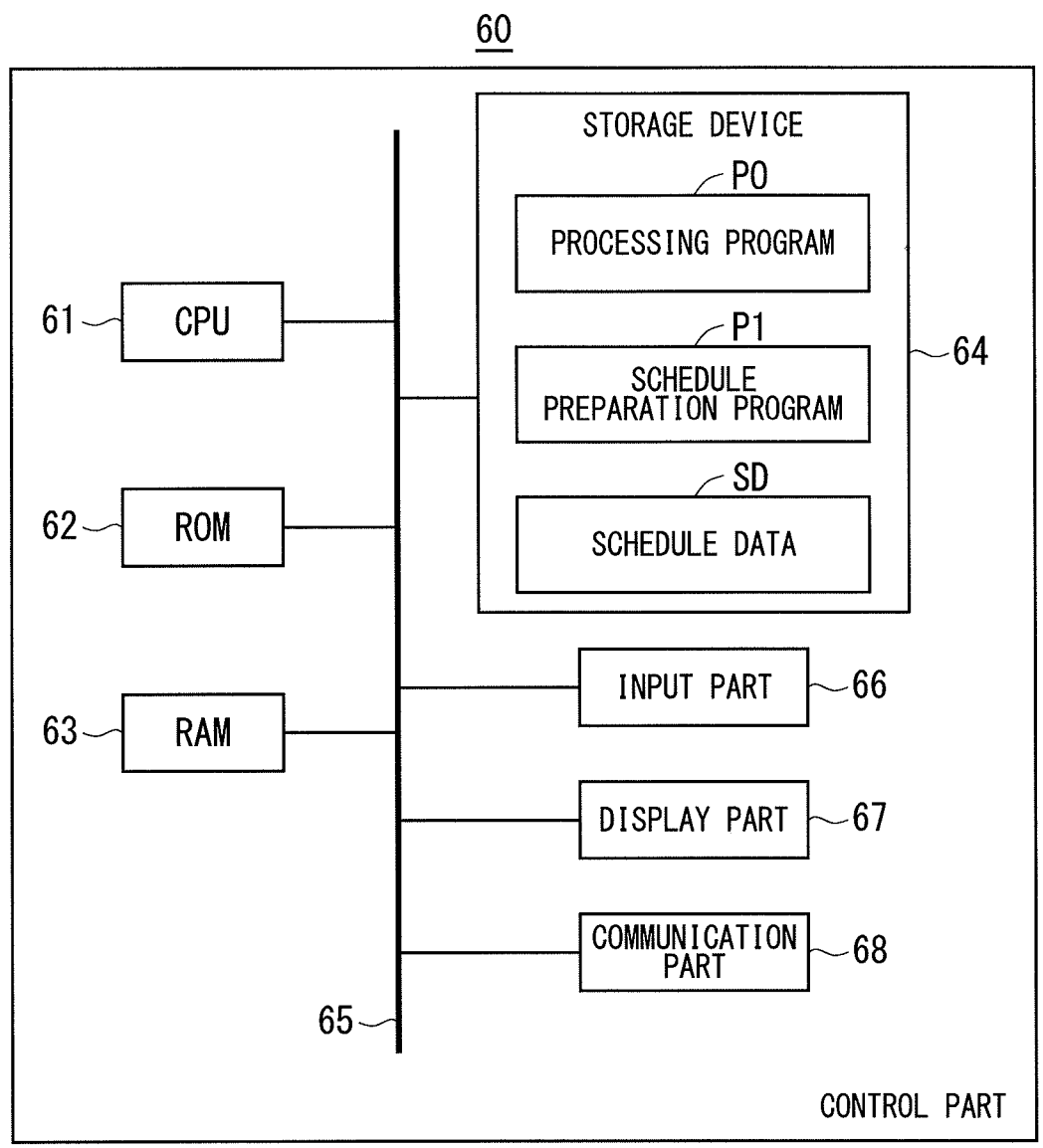

FIG. 12A
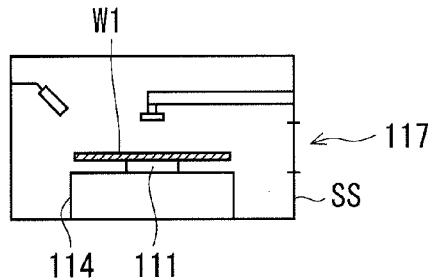 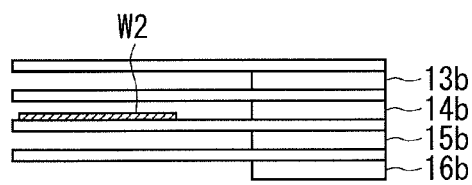
FIG. 12B
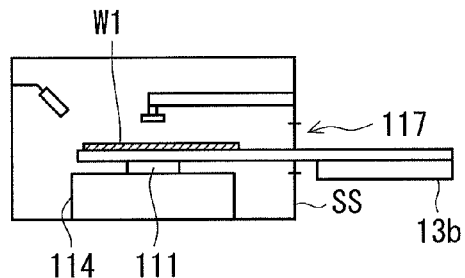 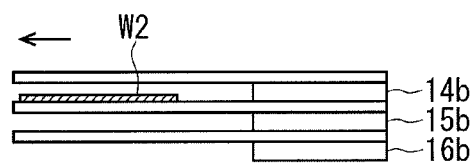
FIG. 12C
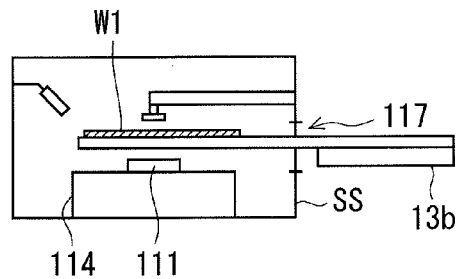 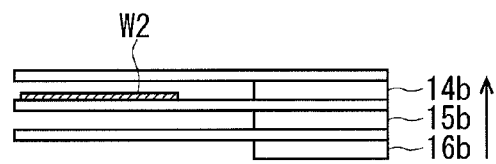
FIG. 12D
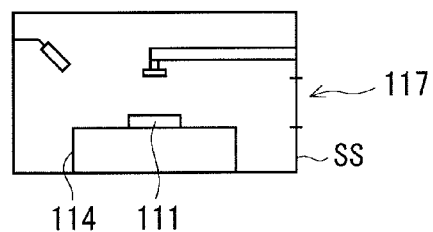 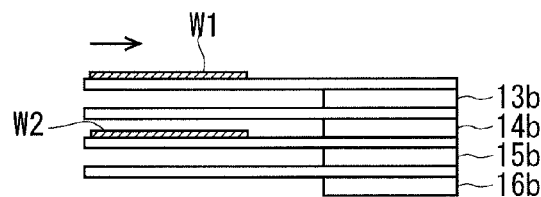

FIG. 13A
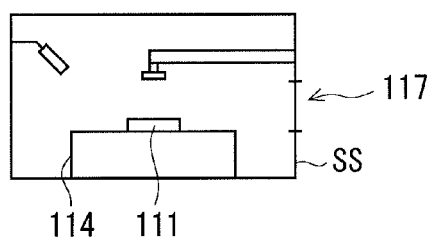
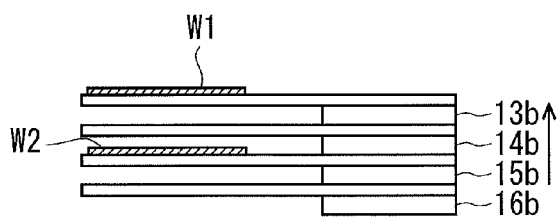
FIG. 13B
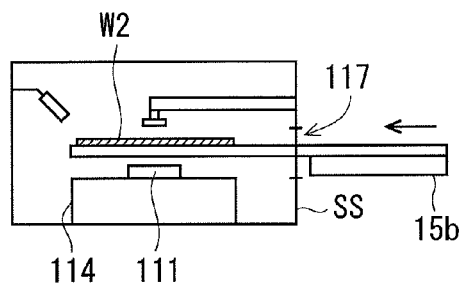
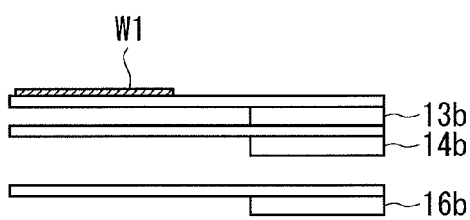
FIG. 13C
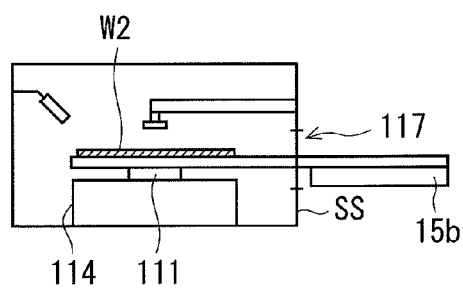
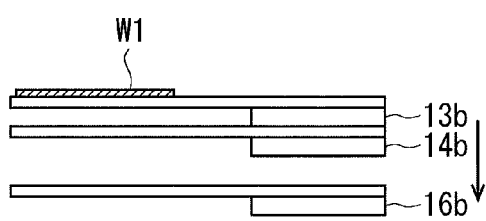
FIG. 13D
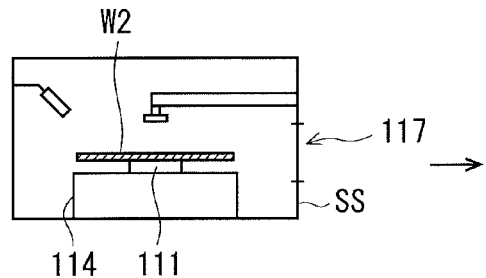
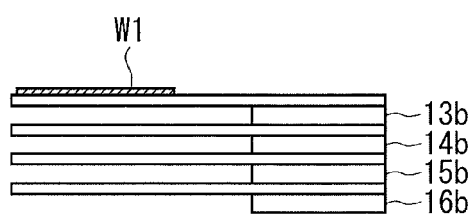

FIG. 15

| | S1 | S2 | S3 | S4 | S5 | S6 | S7 | S8 | S9 | S10 | S11 | S12 | S13 |
|---|---|---|---|---|---|---|---|---|---|---|---|---|---|
| PATTERN 1 "ONLY FRONT SURFACE CLEANING" | C | IR | PASS | CR | SS (FRONT CLEANING) | CR | — | — | — | — | PASS | IR | C |
| PATTERN 2 "ONLY BACK SURFACE CLEANING" | C | IR | RT2 (FRONT TO BACK) | CR | SSR (BACK CLEANING) | CR | — | — | — | — | RT2 (BACK TO FRONT) | IR | C |
| PATTERN 3 "BOTH SURFACES CLEANING (BACK SURFACE →FRONT SURFACE)" | C | IR | RT2 (FRONT TO BACK) | CR | SSR (BACK CLEANING) | CR | RT1 (BACK TO FRONT) | CR | SS (FRONT CLEANING) | CR | PASS | IR | C |
| PATTERN 4 "BOTH SURFACES CLEANING (FRONT SURFACE →BACK SURFACE)" | C | IR | PASS | CR | SS (FRONT CLEANING) | CR | RT1 (FRONT TO BACK) | CR | SSR (BACK CLEANING) | CR | RT2 (BACK TO FRONT) | IR | C |

SUBSTRATE CONVEYANCE METHOD AND SUBSTRATE PROCESSING APPARATUS

BACKGROUND OF THE INVENTION

1. Field of the Invention

The present invention relates to a substrate conveyance method and a substrate processing apparatus which performs the conveyance of a substrate.

2. Description of the Background Art

There have been known various types of substrate processing apparatuses, which apply processing to a substrate. For example, a substrate processing apparatus described in Japanese Patent Application Laid-Open 2010-45214 is configured such that an indexer block where non-processed substrates and processed substrates are stacked and a processing block where processing such as cleaning or the like is applied to substrates are connected with each other with a substrate reversing unit and a substrate placing part sandwiched therebetween. A conveyance robot dedicated to each block is arranged at each of the indexer blocks and each of the processing blocks.

In Japanese Patent Application Laid-Open 2010-45214, an indexer block conveyance robot (main robot) provided with two arms which are independently driven in an extending and retracting manner is disclosed. A substrate holding hand is mounted on distal ends of these two respective arms, and the substrate holding hand is configured to hold two substrates and hence, the conveyance robot can convey four substrates in total.

However, Japanese Patent Application Laid-Open 2010-45214 completely fails to disclose at which timing and to which processing unit the main robot should get access in performing a series of substrate processing. Accordingly, in carrying out a series of substrate processing, a conveyance schedule of each substrate cannot be properly set corresponding to a situation.

SUMMARY OF THE INVENTION

The present invention is directed to a substrate conveyance method. The substrate conveyance method is a substrate conveyance method where a segment which is capable of simultaneously hold M pieces of substrates defined by an integer M of 2 or more is provided, and a substrate conveyance part is capable of simultaneously conveying N pieces of substrates defined by an integer N of 2 or more which is not a divisor of the integer M from the segment or toward the segment, wherein the substrate conveyance method includes a following substrate conveyance cycle, and performs the substrate conveyance cycle repeatedly, wherein when N pieces of variables ik defined by integers k of 1 to N are arbitrary integers of 0 or more and not more than (M/N) and satisfy a following formula 1, $$M = \sum_{k=1}^{N} \{(N - k + 1) \times ik\} \quad \text{(Formula 1)}$$

a conveyance step where a substrate conveyance step of simultaneously conveying (N−k−1) pieces of substrates from the segment or toward the segment by the substrate conveyance part is performed ik times is performed with respect to the conveyance step where the number of times of the substrate conveyance steps is defined by each variable which is a natural number out of the N pieces of variables ik.

During a period where the substrate conveyance part executes the substrate conveyance cycle one time, M pieces of substrates can be conveyed from the segment which holds M pieces of substrates or M pieces of substrates can be conveyed toward the segment. By repeatedly executing such a substrate conveyance cycle, the substrate conveyance part can perform the conveyance of the substrates with a constant rhythm. As a result, in preparing a schedule at the time of conveying a plurality of substrates, a schedule with improved time efficiency can be prepared. That is, in performing a series of substrate processing, the conveyance schedules of each of the substrates can be properly set depending on a situation so that a throughput of the substrate processing apparatus can be enhanced.

Preferably, the segment is a substrate processing part provided with a plurality of substrate processing units, each of the substrate processing units holds and processes one piece of the substrate for each substrate processing unit, and the substrate conveyance cycle is repeatedly performed based on the formula 1 when the number of the substrate processing units capable of performing processing in parallel in the substrate processing part is M.

For example, during a period where the substrate conveyance part executes the substrate conveyance cycle one time, M pieces of substrates are conveyed from the substrate processing part which can process M pieces of substrates in parallel or M pieces of substrates are conveyed toward such a substrate processing part. Since such a substrate conveyance cycle is repeatedly executed, the substrate conveyance part can perform the conveyance of the substrates with a constant rhythm.

Preferably, the substrate conveyance cycle includes: a step of performing a substrate conveyance step of simultaneously conveying N pieces of substrates from the substrate processing part or toward the substrate processing part the number of times which agrees with a quotient of an integer obtained by division where the integer M is divided by the integer N; and a step of performing the substrate conveyance step of simultaneously conveying the substrates of the number which agrees with the number of remainders obtained by dividing the integer M by the integer N from the substrate processing part or toward the substrate processing part one time.

During a period where the substrate conveyance part performs the substrate conveyance cycle one time, M pieces of substrates are conveyed from the substrate processing part which can process M pieces of substrates in parallel or M pieces of substrates are conveyed toward such a substrate processing part. Since such a substrate conveyance cycle is repeatedly executed, the substrate conveyance part can perform the conveyance of the substrate with a constant rhythm.

Preferably, the integer M is decided based on a flow recipe which designates regions where the substrate is to be held in the segment.

The regions where the substrate is to be held in each segment can be accurately decided.

According to another aspect of the present invention, there is provided a substrate conveyance method which uses: a first segment capable of simultaneously holing M1 pieces of substrates defined by an integer M1 of 2 or more; a second segment capable of simultaneously holding M2 pieces of substrates defined by an integer of M2 of 2 or more; and a substrate conveyance part capable of sequentially conveying the substrates to the first segment and the second segment and also capable of holding N pieces of substrates defined by an integer N of 2 or more which is not a divisor of at least one of the integer M1 and the integer M2, wherein the substrate conveyance method includes a following substrate conveyance cycle, and performs the substrate conveyance cycle repeatedly, wherein when the greatest common divisor of the integer M1 and the integer M2 is an integer M3, and variables ik defined by integers k of 1 to N are arbitrary integers of 0 or more and not more than (M3/N) and satisfy a following formula 2, $$M3 = \sum_{k=1}^{N} \{(N-k+1) \times ik\} \quad \text{(Formula 2)}$$

a conveyance step where a substrate conveyance step in which an operation of simultaneously conveying (N−k−1) pieces of substrates toward the first segment, an operation of conveying out the (N−k−1) pieces of substrates from the first segment, and an operation of simultaneously conveying the (N−k−1) pieces of substrates toward the second segment are sequentially executed is performed ik times is performed by the substrate conveyance part with respect to the conveyance step where the number of times of the substrate conveyance steps is defined by each variable which is a natural number out of the N pieces of variables ik.

During a period where the substrate conveyance part executes the substrate conveyance cycle one time, the conveying of M3 pieces of substrates into the first segment and the conveying—out of the substrates from the first segment and the conveying of M3 pieces of substrates into the second segment are performed. By repeatedly executing such a substrate conveyance cycle, the substrate conveyance part can perform the conveyance of the substrates with a constant rhythm. As a result, in preparing a schedule at the time of conveying a plurality of substrates, a schedule with improved time efficiency can be prepared. That is, in performing a series of substrate processing, the conveyance schedules of each of the substrates can be properly set depending on a situation so that a throughput of the substrate processing apparatus can be enhanced.

Preferably, the first segment is a first substrate processing part provided with a plurality of first substrate processing units, each of the first substrate processing units holds and processes one piece of substrate for each first substrate processing unit, the second segment is a second substrate processing part provided with a plurality of second substrate processing units, each of the second substrate processing units holds and processes one piece of substrate for each second substrate processing unit, and the substrate conveyance cycle is repeatedly performed based on the formula 2 when the number of the first substrate processing units capable of performing processing in parallel in the first substrate processing part is the integer M1, and the number of the second substrate processing units capable of performing processing in parallel in the second substrate processing part is the integer M2.

The substrate conveyance part can perform the conveyance of the substrates with a constant rhythm among the first substrate processing unit of the first substrate processing part, the second substrate processing unit of the second substrate processing part and the substrate conveyance part.

Preferably, the substrate conveyance cycle includes: a step of performing the substrate conveyance step of sequentially performing an operation of simultaneously conveying the N pieces of substrates toward the first segment, an operation of conveying out the N pieces of substrates from the first segment and simultaneously conveying the N pieces of substrates toward the second segment the number of times which agrees with a quotient of an integer obtained by dividing the integer M3 by the integer N; and a step where the substrate conveyance step where the substrates of the number which agrees with a remainder obtained by dividing the integer M3 by the integer N are simultaneously conveyed toward the first segment and, subsequently, are conveyed out from the first segment and are simultaneously conveyed toward the second segment is performed one time.

During a period where the substrate conveyance part executes the substrate conveyance cycle one time, M3 pieces of substrate can be conveyed among the first substrate processing unit of the first processing part, the second substrate processing unit of the second processing part and the substrate conveyance part. By repeatedly executing such a substrate conveyance cycle, the substrate conveyance part can perform the conveyance of the substrates with a constant rhythm.

Preferably, the integer M1 and the integer M2 are decided based on a flow recipe which designates regions where the substrate is to be held in each of respective segments.

The regions where the substrates are to be held in each of the segments can be decided precisely.

The present invention is also directed to a substrate conveyance apparatus. The substrate conveyance apparatus includes: a segment which simultaneously holds M pieces of substrates defined by an integer M of 2 or more; a substrate conveyance part which is capable of simultaneously conveying N pieces of substrates defined by an integer N of 2 or more which is not a divisor of the integer M from the segment or toward the segment; and a control part which makes the substrate conveyance part repeatedly perform a substrate conveyance cycle where a substrate conveyance step of simultaneously conveying (N−k−1) pieces of substrates from the segment or toward the segment is performed ik times with respect to the conveyance step where the number of times of the substrate conveyance steps is defined by each variable ik which is a natural number out of the N pieces of variables ik when N pieces of variables ik defined by integers k of 1 to N are arbitrary integers of 0 or more and not more than (M/N) and satisfy a following formula 1, $$M = \sum_{k=1}^{N} \{(N-k+1) \times ik\} \quad \text{(Formula 1)}$$

During a period where the substrate conveyance part executes the substrate conveyance cycle one time, M pieces of substrates can be conveyed from the segment which holds M pieces of substrates or M pieces of substrates can be conveyed toward the segment. By repeatedly executing such a substrate conveyance cycle, the substrate conveyance part can perform the conveyance of the substrates with a constant rhythm. As a result, in preparing a schedule at the time of conveying a plurality of substrates, a schedule with improved time efficiency can be prepared. That is, in performing a series of substrate processing, the conveyance schedules of each of the substrates can be properly set depending on a situation so that a throughput of the substrate processing apparatus can be enhanced.

According to another aspect of the present invention, there is provided a substrate conveyance apparatus which includes: a first segment which simultaneously holds M1 pieces of substrates defined by an integer M1 of 2 or more; a second segment which simultaneously holds M2 pieces of substrates defined by an integer of M2 of 2 or more; a substrate conveyance part capable of sequentially conveying the substrates to the first segment and the second segment and also capable of holding N pieces of substrates defined by an integer N of 2 or more which is not a divisor of at least one of the integer M1 and the integer M2, and a control part which makes the substrate conveyance part to repeatedly execute a substrate conveyance cycle where a conveyance step in which a substrate conveyance step where an operation of simultaneously conveying the (N−k−1) pieces of substrates toward the first segment, an operation of conveying out the (N−k−1) pieces of substrates from the first segment, and an operation of simultaneously conveying (N−k−1) pieces of substrates toward the second segment are sequentially performed is performed ik times is performed with respect to the conveyance step where the number of times of the substrate conveyance steps is defined by each of the variables which are natural numbers out of the N pieces of variables ik assuming that the greatest common divisor of the integer M1 and the integer M2 is an integer M3, and N pieces of variables ik defined by integers k of 1 to N are arbitrary integers of 0 or above and not more than (M3/N) and satisfy a following formula 2, $$M3 = \sum_{k=1}^{N} \{(N - k + 1) \times ik\} \quad \text{(Formula 2)}$$

During a period where the substrate conveyance part executes the substrate conveyance cycle one time, the conveying of M3 pieces of substrates into the first segment and the conveying—out of the substrates from the first segment and the conveying of M3 pieces of substrates into the second segment are performed. By repeatedly executing such a substrate conveyance cycle, the substrate conveyance part can perform the conveyance of the substrates with a constant rhythm. As a result, in preparing a schedule at the time of conveying a plurality of substrates, a schedule with improved time efficiency can be prepared. That is, in performing a series of substrate processing, the conveyance schedules of each of the substrates can be properly set depending on a situation so that a throughput of the substrate processing apparatus can be enhanced.

In view of the above, it is an object of the present invention to provide a technique for enhancing the throughput of the substrate processing apparatus by properly setting a conveyance schedule of each substrate depending on a situation in performing a series of substrate processing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic view showing the entire constitution of a substrate processing apparatus 1 according to a first preferred embodiment;

FIGS. 2 and 3 are side views of a processing section 3 according to the first preferred embodiment;

FIG. 9 is a top plan view of the relay unit 50a according to the first preferred embodiment;

FIG. 11 is a block diagram showing the constitution that a control part 60 according to the first preferred embodiment has;

FIGS. 12A to 12D, and 13A to 13D are conceptual views for describing a substrate transfer operation between the center robot CR and the cleaning processing unit according to the first preferred embodiment;

FIG. 15 is a table showing an example of a substrate conveyance pattern which the substrate processing apparatus 1 can adopt;

DESCRIPTION OF THE PREFERRED EMBODIMENTS

Hereinafter, preferred embodiments of the present invention are described in detail with reference to attached drawings.

{First Preferred Embodiment}
<1. Schematic Constitution of Substrate Processing Apparatus 1>

Figure 2:
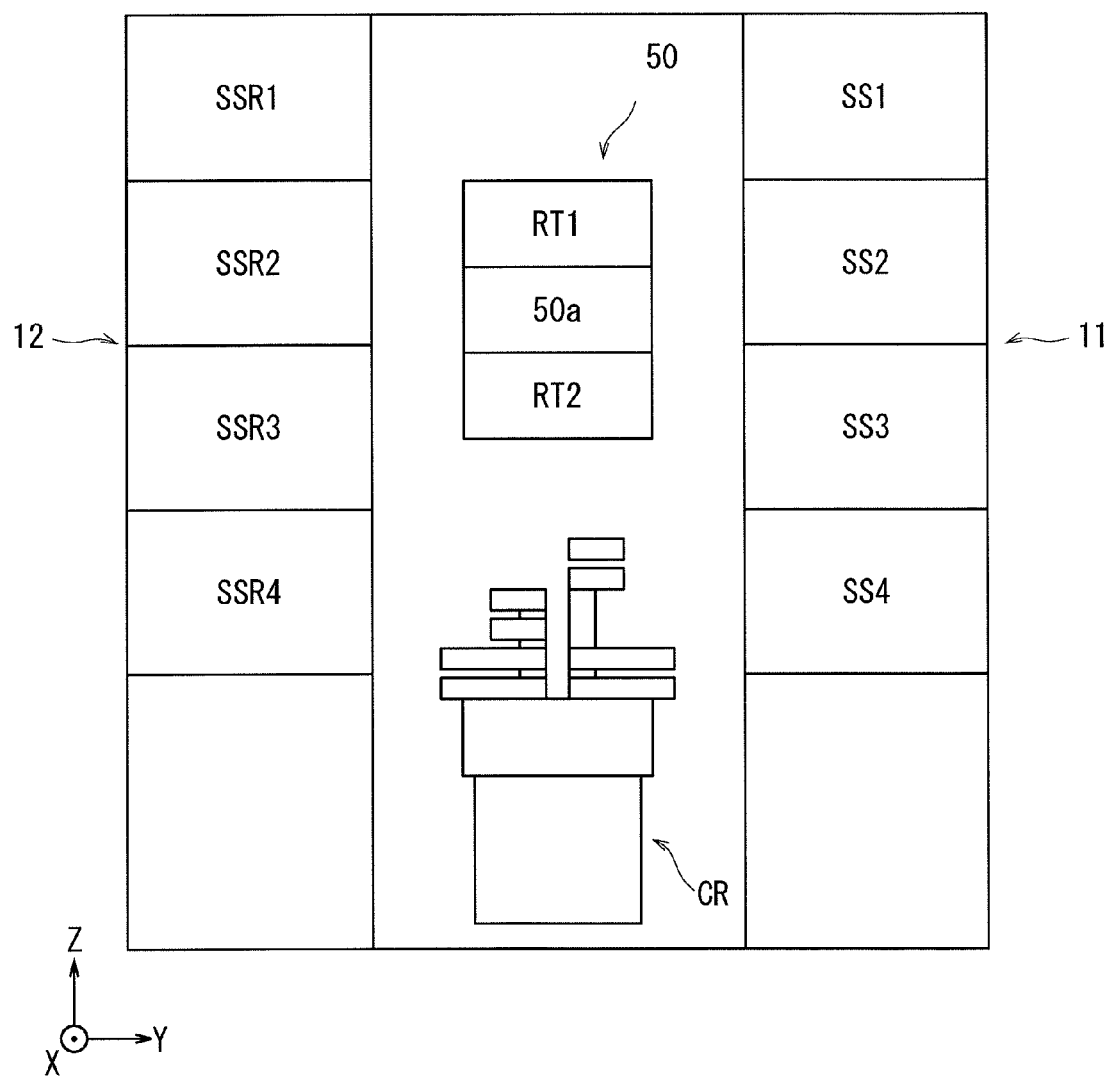

FIG. 1 is a plan view showing a layout of a substrate processing apparatus 1 according to a first preferred embodiment of the present invention. FIG. 2 is a side view of the substrate processing apparatus 1 as viewed in the direction indicated by an arrow a from a cross section taken along a line A-A in FIG. 1. FIG. 3 is a side view of the substrate processing apparatus 1 as viewed in the direction indicated by an arrow b from a cross section taken along a line A-A in FIG. 1. In the drawings attached to this specification, the X direction and the Y direction are two-dimensional coordinate axes which define a horizontal plane, and the Z direction defines the vertical direction perpendicular to the X-Y plane.

The substrate processing apparatus 1 is a sheet-type substrate cleaning apparatus which processes substrates W such as semiconductor wafers one by one. As shown in FIG. 1, the substrate processing apparatus 1 includes: an indexer section 2 and a processing section 3 which is joined to the indexer section 2, and a relay part 50 is arranged on a boundary portion between the indexer section 2 and the processing section 3. The relay part 50 includes: a relay unit 50a for transferring the substrate W between the indexer robot IR and the center robot CR; a reverse unit (RT1) for reversing the substrate W between the indexer robot IR and the center robot CR; and a reverse and transfer unit (RT2) for transferring the substrate W between the indexer robot IR and the center robot CR while reversing the substrate W. As shown in FIG. 2, the relay part 50 has a laminated structure where the reverse unit RT1 is arranged above the relay unit 50a, and the reverse and transfer unit (RT2) is arranged below the relay unit 50a.

The substrate processing apparatus 1 includes a control part 60 for controlling operations of each of the devices of the substrate processing apparatus 1. The processing section 3 is a section where the substrate processing such as a scrub cleaning processing described later is performed. The substrate processing apparatus 1 constitutes a sheet-type substrate cleaning device as a whole. The control part 60 is connected to a host computer which is arranged outside the substrate processing apparatus 1 through LAN. From the host computer, a process recipe PR which decides substrate processing content on each substrate W in a surface cleaning processing part SS or in a back surface cleaning processing part SSR is transmitted to the control part 60. Also from the host computer, a flow recipe FR which decides conveyance contents of individual substrates W in the substrate processing apparatus 1 is transmitted to the control part 60. The control part 60 prepares a conveyance schedule for each substrate W in the substrate processing apparatus 1 by referencing to a flow recipe FR which the control part 60 receives. In the substrate processing apparatus 1 according to the first preferred embodiment, a computer program for preparing processing and conveyance schedule for each substrate in the form of digital data is stored in the control part 60 in advance. Further, when the computer of the control part 60 executes the computer program, a schedule preparing unit is realized as one function of the control part 60. The operations will be described in detail later.

<1.1 Indexer Section>

The indexer section 2 is a section for transferring the substrate W (non-processed substrate W) which is received from the outside of the substrate processing apparatus 1 to the processing section 3 and for conveying out the substrate W (processed substrate W) which is received from the processing section 3 to the outside of the substrate processing apparatus 1. The indexer section 2 includes: carrier holding portions 4 each of which can hold a carrier C capable of accommodating a plurality of substrates W; the indexer robot IR which constitutes substrate conveyance means (also referred to as "substrate conveyance portion"); and an indexer robot moving mechanism 5 (hereinafter referred to as "IR moving mechanism 5") which moves the indexer robot IR horizontally.

The carrier C can hold a plurality of substrates W in a state where the plurality of substrates W are arranged at predetermined intervals in the vertical direction in a horizontal posture, for example. The carrier C holds the plurality of substrates W in a state where a front surface (a main surface on which electronic devices are mounted out of two main surfaces) of each substrate W faces upward. The plurality of carriers C are held in the carrier holding portion 4 in a state where the plurality of carriers C are arranged along a predetermined arrangement direction (Y direction in the first preferred embodiment). The IR moving mechanism 5 can move the indexer robot IR horizontally along the Y direction.

The carriers C each of which stores a non-processed substrate W are conveyed and placed in each carrier holding portion 4 from the outside of the substrate processing apparatus 1 using an OHT (Overhead Hoist Transfer), an AGV (Automated Guided Vehicle) or the like. A processed substrate W to which substrate processing such as a scrub cleaning processing in the processing section 3 has been applied is transferred to the indexer robot IR from the center robot CR through the relay part 50, and is stored again in the carrier C placed on the carrier holding portion 4. The carrier C which stores the processed substrate W is conveyed to the outside of the substrate processing apparatus 1 by OHT or the like. That is, the carrier holding portion 4 functions as a substrate stacking portion where the non-processed substrates W and the processed substrates W are stacked.

The constitution of the IR moving mechanism 5 according to the preferred embodiment is described. A movable base is fixedly mounted on the indexer robot IR, and the movable base is threadedly engaged with a ball screw which extends in parallel to the arrangement direction of the carriers C along the Y direction, and is mounted in a slidable manner with respect to a guide rail. Accordingly, when the ball screw is rotated by a rotary motor, the whole indexer robot IR on which the movable base is fixedly mounted is moved horizontally along the Y-axis direction (both the rotation of the ball screw and the movement of the indexer robot IR are not shown). In this manner, since the indexer robot IR is movable along the Y direction, the indexer robot IR can be moved to positions where the indexer robot IR can convey the substrate into and out from the respective carriers C or the relay part 50 (the conveying-in and conveying-out of the substrate also being referred to as "access").

Figure 4:
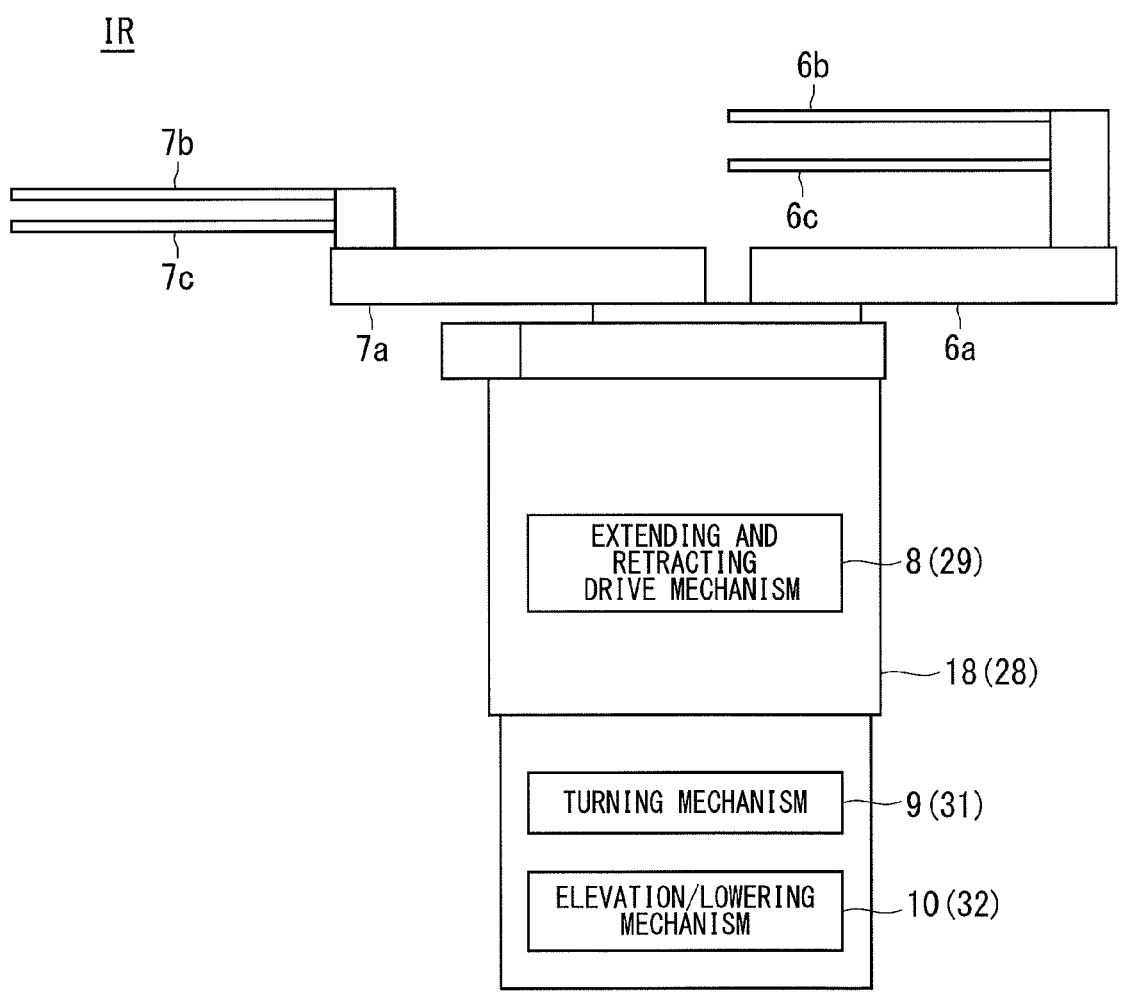
FIG. 4 is a schematic view showing the constitution of an indexer robot IR according to the first preferred embodiment.

FIG. 4 is an illustrative side view of the indexer robot IR. Out of reference symbols attached to each element in FIG. 4, the reference symbols in parentheses indicate elements of the center robot CR in the case where a robot mechanism having the substantially same degree of freedom as the indexer robot IR is used also as the center robot CR. Accordingly, in the present preferred embodiment, the constitution of the indexer robot IR is described by referencing to the reference symbols outside the parentheses.

The indexer robot IR has a base part 18. One end of an arm 6a and one end of an arm 7a are mounted on the base part 18, and hands 6b, 6c and hands 7b, 7c are arranged on the other ends of the respective arms such that the hands 6b, 6c and the hands 7b, 7c are displaced from each other in height in the vertical direction so as to prevent the interference therebetween (in FIG. 1, the hands 6b, 6c and the hands 7b, 7c overlap with each other in the vertical direction). Accordingly, the hands 6b, 6c are held by the base part 18 by way of the arm 6a.

The hands 7b, 7c are held by the base part 18 by way of the arm 7a. Distal ends of the respective hands 6b, 6c, 7b, 7c each have a pair of finger portions. That is, the distal ends of the respective hands 6b, 6c, 7b, 7c are formed into a bifurcated fork shape as viewed in a top plan view, and since the hands 6b, 6c, 7b, 7c support a lower surface of the substrate W from below, one piece of substrate W can be held in a horizontal posture. In the present preferred embodiment, the hands 7b, 7c are used only when a non-processed substrate before cleaning processing is performed is conveyed, and the hands 6b, 6c are used only when a processed substrate after cleaning processing is performed is conveyed. An outer size of the pair of finger portions of each hand is set smaller than a distance between a pair of support members 54 which is arranged to face each other in an opposed manner in the relay part 50 (FIG. 9). Accordingly, in the substrate conveying operation and the substrate conveying-out operation described later, the hands 6b, 6c, 7b, 7c can convey the substrate W into and out from the relay part 50 without interfering with the support members 54.

The outer size of the pair of finger portions of each hand 6b, 6c, 7b, 7c is set smaller than a diameter of the substrate W. Accordingly, the hands 6b, 6c, 7b, 7c can hold the substrate W in a stable manner. Although the indexer robot IR has four hands 6b, 6c, 7b, 7c, the indexer robot IR is constituted as a robot mechanism which can simultaneously transfer two non-processed substrates at maximum, and can transfer two processed substrates simultaneously at maximum. Both the arm 6a and the arm 7a are formed of an articulated-type stretchable arm. The indexer robot IR can extend and retract the arm 6a and the arm 7a individually using an extending and retracting drive mechanism 8. Accordingly, it is possible to horizontally extend and retract the hands 6b, 6c and the hands 7b, 7c respectively corresponding to the arms 6a, 7a in a separated manner.

A turning mechanism 9 for rotating the base part 18 around a vertical axis, and an elevating/lowering mechanism 10 for elevating and lowering the base part 18 in the vertical direction are incorporated into the base part 18. Due to such a constitution, the indexer robot IR is movable along the Y direction by the IR moving mechanism 5. The indexer robot IR can adjust angles of the hands in a horizontal plane and heights of the hands in the vertical direction by the turning mechanism 9 and the elevating/lowering mechanism 10. Accordingly, the indexer robot IR can make each of the hands 6b, 6c and the hands 7b, 7c face the carrier C and the relay part 50 in an opposed manner. The indexer robot IR can make the hands 6b, 6c and the hands 7b, 7c which correspond to the arms 6a, 7a, respectively, get access to the carrier C and the relay part 50 by extending the arm 6a or the arm 7a in a state where the hands 6b, 6c and the hands 7b, 7c face the carrier C in an opposed manner.

<1.2 Processing Section>

The processing section 3 is a section where cleaning processing is applied to the non-processed substrate W conveyed from the indexer section 2. The processed substrate W to which the cleaning processing is applied is conveyed to the indexer section 2 again.

The processing section 3 includes: a front surface cleaning processing part 11 where cleaning processing is applied to a front surface of a substrate on one-by-one basis; a back surface cleaning processing part 12 where cleaning processing is applied to a back surface of the substrate on one-by-one basis; the center robot CR which constitutes conveyance means for conveying a substrate (also referred to as a substrate conveyance part); and a center robot moving mechanism 17 (hereinafter referred to as "CR moving mechanism 17") which moves the center robot CR horizontally. Hereinafter, the constitutions of devices in the processing section 3 are described.

As shown in FIG. 1 to FIG. 3, the cleaning processing part 11 includes two sets of front surface cleaning processing units SS1 to SS4 and SS5 to SS8, in which each set of front surface cleaning processing units is constituted such that four front surface cleaning processing units SS1 to SS4 or SS5 to SS8 are stacked to each other in the vertical direction thus forming the four-stage constitution. The cleaning processing part 12 includes two sets of back surface cleaning processing units SSR1 to SSR4 and SSR5 to SSR8, in which each set of back surface cleaning processing units is constituted such that four back surface cleaning processing units SSR1 to SSR4 or SSR5 to SSR8 are stacked to each other in the vertical direction thus forming the four-stage constitution. As shown in FIG. 1, the front surface cleaning processing part 11 and the back surface cleaning processing part 12 are arranged in parallel in a state where the front surface cleaning processing part 11 and the back surface cleaning processing part 12 are spaced-apart from each other along the Y direction with a predetermined distance therebetween. The center robot CR is arranged between the front surface cleaning processing part 11 and the back surface cleaning processing part 12.

Figure 5:
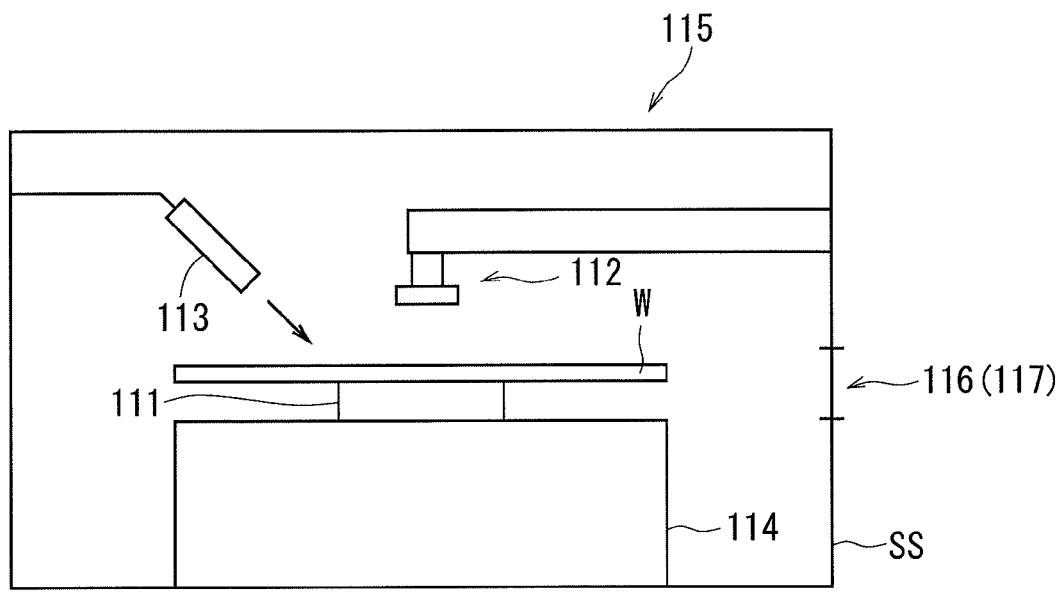
FIG. 5 is a schematic view showing the constitution of a cleaning processing unit according to the first preferred embodiment.

FIG. 5 is a view showing a state of scrub cleaning processing applied to a front surface of a substrate W in each of the cleaning processing units SS1 to SS8 of the front surface cleaning processing part 11. The cleaning processing units SS1 to SS8 each include: a spin chuck 111 which holds the substrate W having a front surface which faces upward in a horizontal posture and rotates the substrate W about an axis extending along the vertical direction; a cleaning brush 112 which is brought into contact with or is disposed adjacent to the front surface of the substrate W held on the spin chuck 111 thus applying the scrub cleaning to the front surface of the substrate W; a nozzle 113 which discharges a cleaning liquid (for example, pure water) to the front surface of the substrate W; a spin rotation support portion 114 which rotatably drives the spin chuck 111; a cup (not shown in the drawing) which surrounds the periphery of the substrate W held on the spin chuck 111 and the like; and a unit case 115 which accommodates these members. In the unit case 115, a gate 117 where a slit 116 which can be opened and closed by sliding is formed is provided for conveying the substrate W into and out from the unit case 115.

In the back surface cleaning processing part 12, the scrub cleaning processing of the back surface of the substrate W is performed. Also the back surface cleaning processing units SSR1 to SSR8 each include, in the same manner as the front surface cleaning processing units SS1 to SS8, a spin chuck, a cleaning brush, a nozzle, a spin motor, a cup, and a unit case which accommodates these members. In the unit case, a gate where an openable/closable slit is formed is provided for conveying the substrate W into and out from the unit case is formed (these members not shown in the drawing).

The spin chucks 111 of the front surface cleaning processing units SS1 to SS8 hold the substrate W from a back surface side and hence, the spin chuck 111 may be formed of a vacuum-suction-type spin chuck. However, the spin chucks of the back surface cleaning processing units SSR1 to SSR8 hold the substrate W from a front surface side of the substrate W and hence, it is preferable to use a spin chuck of a type which mechanically holds edge portions of a substrate.

When the front surface of the substrate W is cleaned by the cleaning brush 112, a brush moving mechanism not shown in the drawing moves the cleaning brush 112 to an area above the substrate W which is held by the spin chuck 111 in a state where the front surface of the substrate W faces upward. Then, a processing liquid (for example, pure water (deionized water)) is supplied to an upper surface of the substrate W from the nozzle 113 while the substrate W is rotated by the spin chuck 111, and the cleaning brush 112 is brought into contact with the upper surface of the substrate W. The cleaning brush 112 is moved along the upper surface of the substrate W in a state where the cleaning brush 112 is brought into contact with the upper surface of the substrate W. Due to such an operation, the upper surface of the substrate W is scanned by the cleaning brush 112 thus applying the scrub cleaning to the whole region of the front surface of the substrate W. In this manner, the cleaning processing is applied to the front surface of the substrate W. The same goes for the cleaning processing applied to the back surface of the substrate W.

In the present preferred embodiment, the cleaning processing units SS1 to SS8 and SSR1 to SSR8 in the cleaning processing parts 11, 12 are described as devices for performing the scrub cleaning of the substrate W. However, the substrate processing which the cleaning processing units SS1 to SS8 and SSR1 to SSR8 in the cleaning processing parts 11, 12 perform is not limited to the scrub cleaning. For example, cleaning processing units SS1 to SS8 and SSR1 to SSR8 may be formed of a cleaning processing unit which does not perform the brush cleaning but performs single wafer cleaning of the substrate W using a processing liquid (cleaning liquid, rinse liquid and the like) or a fluid such as a gas which is discharged from the nozzle or the like which faces the front surface or the back surface of the substrate in an opposed manner.

Figure 6:
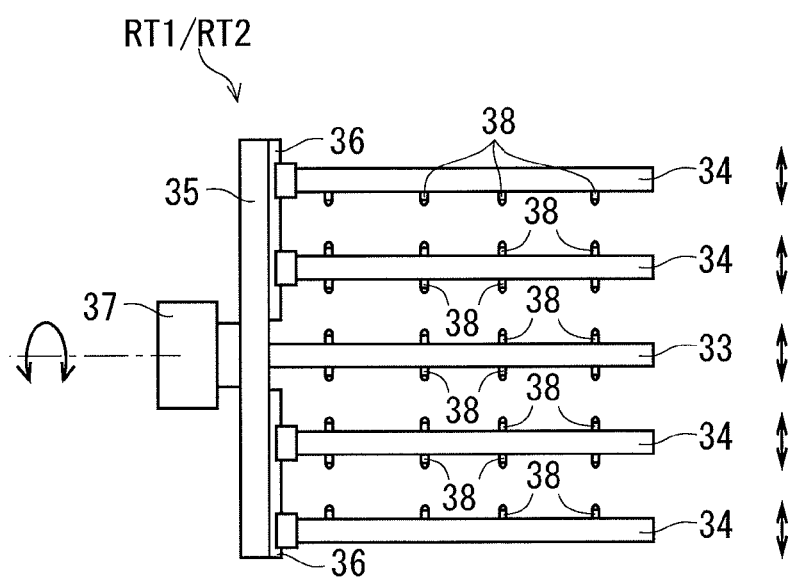
FIG. 6 is a schematic view showing the constitution of a reverse processing unit RT according to the first preferred embodiment.

FIG. 6 is an illustrative side view of the reverse unit RT1 and the reverse and transfer unit RT2.

The reverse unit RT1 and the reverse and transfer unit RT2 differ from each other only with respect to a point that the former can be accessed only from the center robot CR, while the latter can be accessed from not only the center robot CR but also from the indexer robot IR and hence, the reverse unit RT1 and the reverse and transfer unit RT2 are described with reference to FIG. 6 in common. The reverse unit RT1 is a processing unit for applying reversing processing to the substrate W conveyed by the center robot CR. When the substrate W is reversed by the reverse unit RT1, the center robot CR conveys out the substrate from the reverse unit RT1. The reverse and transfer unit RT2 can be accessed from both the indexer robot IR and the center robot CR.

When the substrate W is conveyed in the reverse and transfer unit RT2 by the indexer robot IR, the reverse and transfer unit RT2 reverses the substrate W. Thereafter, the center robot CR conveys out the substrate W from the reverse and transfer unit RT2. When the substrate W is conveyed in the reverse and transfer unit RT2 by the center robot CR, the reverse and transfer unit RT2 reverses the substrate W.

Thereafter, the indexer robot IR conveys out the substrate from the reverse and transfer unit RT2.

In the substrate processing apparatus 1 according to the first preferred embodiment, in the cleaning processing units SS1 to SS8, SSR1 to SSR8 of the front surface cleaning processing part 11 and the back surface cleaning processing part 12, the cleaning processing is applied to the upper surface of the substrate (here, the concept of the upper and lower surfaces are irrelevant to the front and the back of the substrate, and an upper side and a lower side of the substrate in the vertical direction at the time constitute the upper surface and the lower surface of the substrate, respectively). Accordingly, in the case where the cleaning processing is to be performed on both surfaces of the substrate, it is necessary to perform the reversing processing of the substrate W separately or independently from the cleaning processing. The reverse unit RT1 and the reverse and transfer unit RT2 are used in this processing.

As shown in FIG. 6, the reverse unit RT1 includes a fixed plate 33 which is arranged in a horizontal posture, and four movable plates 34 which are arranged in a horizontal posture in a state where the fixed plate 33 is sandwiched between the movable plates 34 in the vertical direction. The fixed plate 33 and the four movable plates 34 each have a rectangular shape and are arranged in an overlapping manner as viewed in a plan view. The fixed plate 33 is fixed to a support plate 35 in a horizontal posture, and each of the movable plates 34 are mounted on the support plate 35 in a horizontal posture by way of guides 36 which extend in the vertical direction. Each of the movable plates 34 are movable in the vertical direction with respect to the support plate 35. The respective movable plates 34 are moved in the vertical direction by an actuator such as an air cylinder, not shown in the drawing. A rotary actuator 37 is mounted on the support plate 35. The fixed plate 33 and the four movable plates 34 are integrally rotated about a horizontal axis of rotation by the rotary actuator 37 together with the support plate 35. The rotary actuator 37 can reverse the fixed plate 33 and the four movable plates 34 in the vertical direction by rotating the support plate 35 about the horizontal axis of rotation by 180 degrees.

A plurality of support pins 38 are mounted on oppositely facing surfaces of the fixed plate 33 and the four movable plates 34 respectively (for example, a lower surface of the upper movable plate 34 and an upper surface of the fixed plate 33). The plurality of support pins 38 are arranged at appropriate intervals on the circumference corresponding to an outer peripheral shape of the substrate W on each surface. A height of the respective support pins 38 (a length from a proximal end to a distal end) is fixed, and is set larger than thicknesses (lengths in the vertical direction) of the hands 6b, 6c, the hands 7b, 7c, and hands 13b to 16b.

The fixed plate 33 can support one piece of substrate W in a horizontal posture by way of the plurality of support pins 38 on an upper side thereof. The four movable plates 34 can each support one piece of substrate W in a horizontal posture by way of the plurality of support pins 38 on an upper side thereof when the movable plate 34 is positioned below the substrate W. A distance in the vertical direction between a substrate support position by the fixed plate 33 and a substrate support position by the movable plate 34 is set equal to a distance in the vertical direction between the two substrates W which are held by the hands 6b, 6c and the hands 7b, 7c of the indexer robot IR respectively and a distance in the vertical direction between two pieces of substrates W which are held by the hands 13b to 16b of the center robot CR respectively.

The reverse unit RT1 has the above-mentioned constitution and hence, the center robot CR can make the substrates W which are held by the hands 13b to 16b get access to the reverse unit RT 1 (can convey the substrate W in and out from the reverse unit RT1). The reverse and transfer unit RT2 has the above-mentioned constitution and hence, the indexer robot IR and the center robot CR (hereinafter, the indexer robot IR and the center robot CR also collectively referred to as "robots IR and CR") can make the substrates W which are held by the hands 6b, 6c, the hands 7b, 7c, and the hands 13b to 16b respectively get access to the reverse and transfer unit RT2 (can convey the substrates W in and out from the reverse and transfer unit RT2).

The detail of the transfer operation of the substrate W is described later.

The indexer robot IR or the center robot CR inserts the first substrate W into a gap formed between the fixed plate 33 and the movable plate 34 just above the fixed plate 33, and inserts the second substrate W into a gap formed between the movable plate 34 and the movable plate 34 further above the former movable plate 34. By moving these two movable plates 34 toward the fixed plate 33 in this state, these two substrates W can be held by the reverse unit RT1 or the reverse and transfer unit RT2.

In the same manner, the first substrate W can be held in a gap formed between the fixed plate 33 and the movable plate 34 just below the fixed plate 33, and the second substrate W can be held in a gap formed between the movable plate 34 and the movable plate 34 further below the former movable plate 34.

When the support plate 35 is rotated about the horizontal rotation axis by the rotary actuator 37 in a state where the substrates W are held in the reverse unit RT1, the two substrates W held in the reverse unit RT1 can be reversed in the vertical direction.

As has been described heretofore, the reverse unit RT1 and the reverse and transfer unit RT2 can hold the plurality of (two in the first preferred embodiment) substrates W in a horizontal posture and can reverse the held substrates W in the vertical direction. The constitution of the CR moving mechanism 17 according to the present preferred embodiment is substantially equal to the constitution of the already-described IR moving mechanism 5. That is, the CR moving mechanism 17 includes: a movable base; a ball screw and a guide rail extending in an elongated manner in the X direction; and a rotary motor which rotates the ball screw (all these parts not shown in the drawing). When the ball screw is rotated, the whole center robot CR which is fixedly mounted on the movable base moves horizontally in the X direction in the inside of the processing section 3 while traversing between the front surface cleaning processing part 11 and the back surface cleaning processing part 12.

As described above, the center robot CR is movable along the X direction and hence, the center robot CR is movable to a position where the center robot CR can get access to the respective cleaning processing units SS1 to SS8, SSR1 to SSR8 (can convey the substrates W in and out from the respective cleaning processing units SS1 to SS8, SSR1 to SSR8). In the same manner, the center robot CR is movable to a position where the center robot CR can get access to the relay part 50 (can convey the substrates W in and out from the relay part 50). The center robot CR may have the substantially same constitution as the indexer robot IR shown in FIG. 4. That is, the center robot CR may include a robot mechanism where two sets of two-stage hands which have been fixed to each other are provided in the vertical direction such that two sets of two-stage hands are independently driven in an extensible and retractable manner (hereinafter referred to as "2A4H mechanism" as a meaning of "two sets of arms and four hands"). The center robot CT may also have other constitutions. The constituents of the 2A4H mechanism robot adopted as the indexer robot IR are substantially equal to corresponding constituents of the indexer robot IR which are described in FIG. 4 and hence, repeated description thereof is omitted here.

Figure 7A:
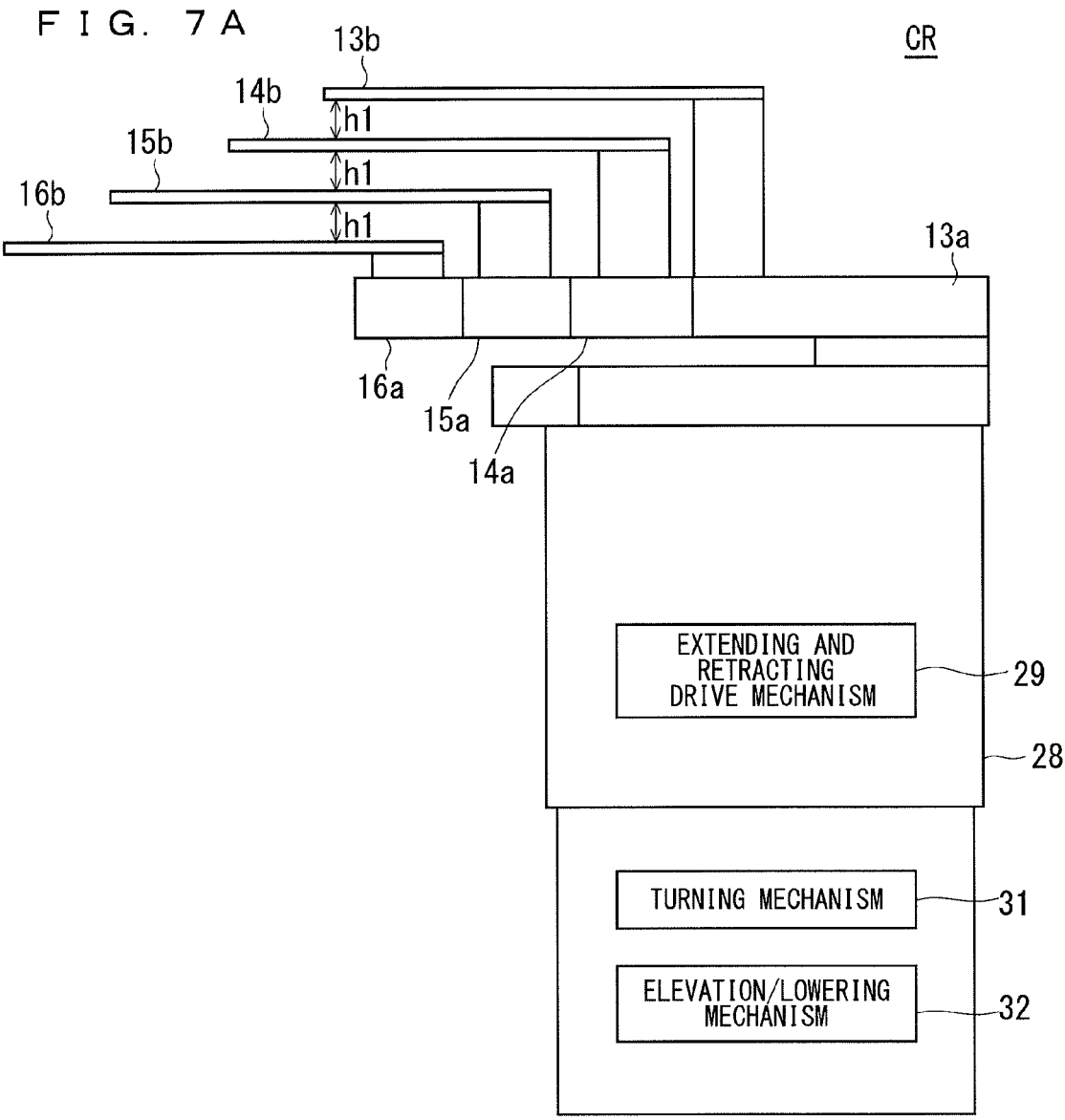
FIG. 7A and FIG. 7B are schematic views showing the constitution of a center robot CR according to the first preferred embodiment.
Figure 7B:
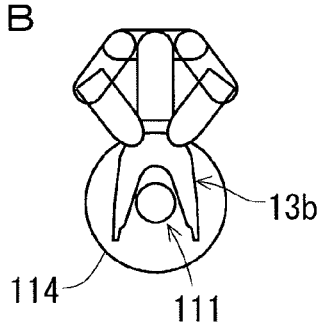

FIG. 7A is an illustrative side view of the center robot CR when the center robot CR adopts the constitution of a type which can drive four arms 13a to 16a by four hands 13b to 16b, respectively, independently in an extensible and retractable manner (hereinafter referred to as "4A4H mechanism"). FIG. 7B is an illustrative top plan view showing a state where the center robot CR gets access to the cleaning processing units SS (SSR) in the substrate conveying-in operation and the substrate conveying-out operation described later. As shown in FIG. 7A, the center robot CR which adopts the 4A4H mechanism includes a base part 28. One ends of each of the arms 13a to 16a are mounted on the base part 28, and hands 13b to 16b are mounted on the other ends of the arms 13a to 16a, respectively. Accordingly, the hands 13b to 16b are held on the base part 28 by way of the arms 13a to 16a, respectively. The hands 13b to 16b are arranged in a displaced manner from each other in height in the vertical direction so as to prevent the interference with the neighboring hands 13b to 16b respectively (arranged in a spaced-apart from each other at an equal distance h1 in the vertical direction). The distal ends of the hands 13b to 16b each have a pair of finger portions. That is, the distal ends of the hands 13b to 16b are each formed into a bifurcated fork shape as viewed in a top plan view, and the hands 13b to 16b can each hold one piece of substrate W in a horizontal posture by supporting a lower surface of the substrate W from below. In the present preferred embodiment, the hands 15b, 16b are used only in conveying of a non-processed substrate before cleaning processing, and the hands 13b, 14b are used only in conveying of a processed substrate after the cleaning processing.

An outer size of the pairs of finger portions of each of the hands 13b to 16b is set smaller than a distance between support pins 55 of the relay part 50 which form a pair and face each other in an opposed manner. Accordingly, in the substrate conveying-in operation and the substrate conveying-out operation described later, it is possible to prevent the hands 13b to 16b from interfering with the support members 54 of the relay part 50. A member pass-through region is formed between the pair of finger portions of the respective hands 13b to 16b. The region is larger than the spin chuck 111 of the substrate cleaning unit SS (SSR). Accordingly, in the substrate conveying-in operation and the substrate conveying-out operation described later, it is possible to prevent the respective hands 13b to 16b from interfering with the spin chuck 111 (see FIG. 7B). Thicknesses of the hands 13b to 16b are each set to sizes smaller than a distance between the upper surface of the spin chuck 111 and an upper surface of the spin rotation support portion 114. Further, all arms 13a to 16a are formed of an articulated-type stretchable arm. The center robot CR can extend and retract the arms 13a to 16a individually using an extending and retracting drive mechanism 29. Accordingly, the hands 13b to 16b which respectively correspond to the arms can be moved horizontally in a separated manner.

A turning mechanism 31 for rotating the base part 28 about a vertical axis and an elevating/lowering mechanism 32 for elevating and lowering the base part 28 in the vertical direction are incorporated in the base part 28.

After the center robot CR is moved to a position where the center robot CR can get access to the respective cleaning processing units SS1 to SS8, SSR1 to SSR8 by the CR moving mechanism 17, by rotating the base part 28 using the turning mechanism 31 to rotate the respective hands 13b to 16b about predetermined vertical axes and by elevating or lowering the base part 28 in the vertical direction by the elevating/lowering mechanism 32, the arbitrary hands 13b to 16b are allowed to face the desired cleaning processing units SS1 to SS8, SSR1 to SSR8 in an opposed manner. Further, by extending the arms 13a to 16a in a state where the hands 13b to 16b face the cleaning processing unit in an opposed manner, it is possible to make the hands 13b to 16b which correspond to the arms get access to the corresponding cleaning processing units. In the same manner, the center robot CR can make the arbitrary hands 13b to 16b get access to the relay part 50.

In both the case where the center robot CR adopts the 2A4H mechanism and the case where the center robot CR adopts the 4A4H mechanism, the maximum number of non-processed substrates which the center robot CR can transfer from the relay part 50 to the processing units SS1 to SS8, SSR1 to SSR8 collectively (simultaneous conveyance) is two, and the maximum number of processed substrates which the center robot CR can transfer from the processing units SS1 to SS8, SSR1 to SSR8 to the relay part 50 collectively is two.

Accordingly, the maximum number of substrates which the center robot CR can transfer collectively is equal between the both cases and hence, hereinafter, to facilitate the understanding of the description, the center robot CR which adopts the 4A4H mechanism is described. However, also when the center robot CR which adopts the 2A4H mechanism is used, operation of individual arms of the center robot CR can be estimated by the operations of the arms of the indexer robot IR. The description has been made with respect to the mode where the hands 13b to 16b of the center robot CR can get access to the processing units SS, SSR and the relay part 50 by using the CR moving mechanism 17 together with the hands 13b to 16b. However, it is needless to say that the respective hands 13b to 16b of the center robot CR are made to get access to the processing units SS, SSR and the relay part 50 by using only the turning mechanism 31, the elevating/lowering mechanism 32 and the extending and retracting drive mechanism 29 without using the CR moving mechanism 17.

<1.3 Relay Unit 50a>

In a boundary portion between the indexer section 2 and the processing section 3, the relay unit 50a which performs transfer and reception of the substrate W between the indexer robot IR and the center robot CR is arranged. The relay unit 50a is formed of a casing having substrate placing parts PASS1 to PASS4. When the transfer and the reception of the substrate W between the indexer robot IR and the center robot CR is performed, the substrate W is temporarily placed on the substrate placing parts PASS1 to PASS4.

Figure 8:
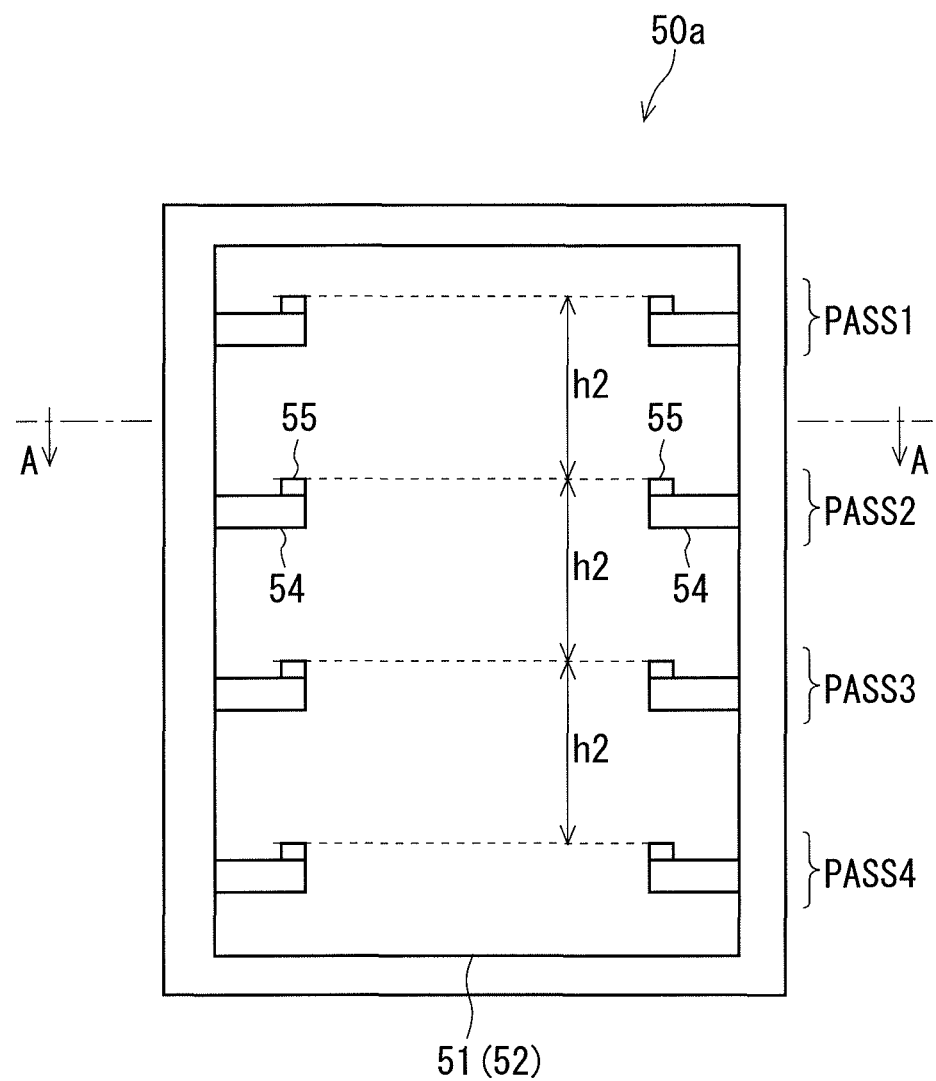
FIG. 8 is a side view of a relay unit 50a according to the first preferred embodiment.

FIG. 8 is a side view of the relay unit 50a according to the first preferred embodiment. Further, FIG. 9 is a top plan view of the relay unit 50a as viewed in the direction indicated by an arrow from a cross section taken along a line A-A in FIG. 8. An opening portion 51 through which the substrate W is conveyed in and out from the casing is formed in one side wall which faces the indexer robot IR in an opposed manner out of side walls of the casing of the relay unit 50a. An opening portion 52 similar to the opening 51 is formed in the other side wall of the casing which is on a side opposite to one side wall and is positioned on a center robot CR side.

In the inside of the casing, on portions of the casing which face the opening portions 51, 52, the substrate placing parts PASS1 to PASS4 for holding the above-mentioned substrate W in a substantially horizontal posture are provided. Accordingly, the indexer robot IR and the center robot CR can get access to the substrate placing parts PASS1 to PASS4 from the opening portions 51, 52. In the present preferred embodiment, the upper substrate placing parts PASS1, PASS2 are used when the processed substrate W is conveyed to the indexer section 2 from the processing section 3, and the lower substrate placing parts PASS3, PASS4 are used when the non-processed substrate W is conveyed to the processing section 3 from the indexer section 2.

As shown in FIG. 8 and FIG. 9, the substrate placing parts PASS1 to PASS4 are each formed of: the pair of support members 54 which is fixedly mounted on the side walls of the casing inside the casing; and two sets of support pins 55 provided to both end portions on an upper surface of each support member 54 where each set is constituted of two support pins 55 (four pins 55 in total). The support members 54 are fixedly mounted on a pair of side walls which differs from the side walls on which the opening portions 51, 52 are formed. An upper end of the support pin 55 is formed into a conical shape. Accordingly, the substrate W is held on two pairs of support pins 55 in a state where four portions on a peripheral portion of the substrate W are engaged with the two pairs of support pins 55 in a detachable manner.

Here, the support pins 55 between the PASS1 and PASS2, the support pins 55 between the PASS2 and PASS3, and the support pins 55 between the PASS3 and PASS4 are arranged in a spaced-apart manner by the same distance h2 in the vertical direction (see FIG. 8). The distance h2 is equal to the interval h1 in the vertical direction between the hands 13b to 16b of the above-mentioned center robot CR. Accordingly, by simultaneously extending the hands 15b, 16b of the center robot CR by operating the extending and retracting drive mechanism 29 in a state where the center robot CR faces the relay unit 50a in an opposed manner, the center robot CR can simultaneously receive two non-processed substrates W from the substrate placing parts PASS3, PASS4 of the relay unit 50a. In the same manner, by simultaneously extending the hands 13b, 14b of the center robot CR by operating the extending and retracting drive mechanism 29, the center robot CR can simultaneously transfer two processed substrates W held by these hands 13b, 14b to the substrate placing parts PASS1, PASS2 of the relay unit 50a.

<1.4 Control Part 60>

Figure 10:
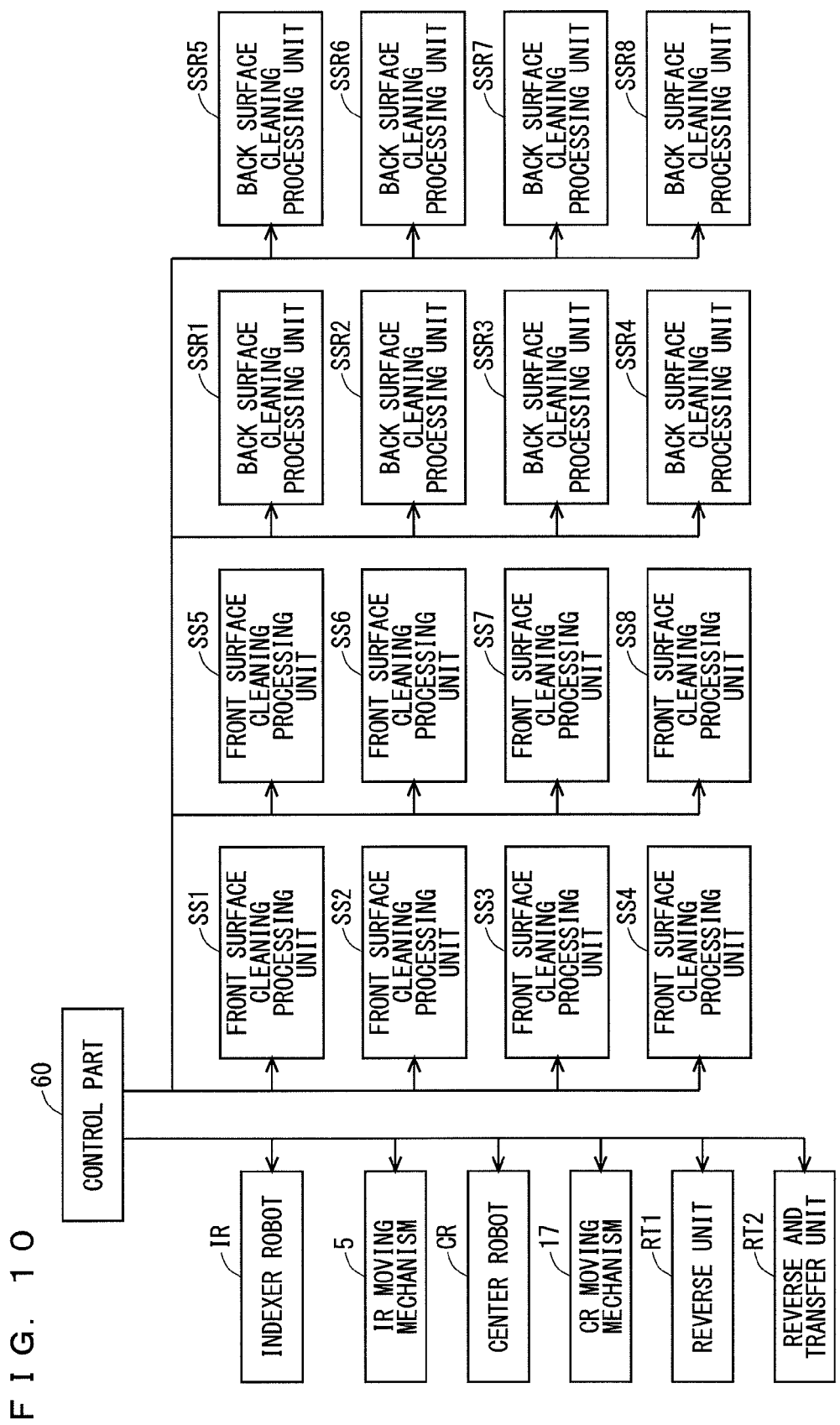
FIG. 10 is a block diagram showing a system of the substrate processing apparatus 1 according to the first preferred embodiment.

FIG. 10 is a block diagram for describing the electric constitution of the substrate processing apparatus 1. FIG. 11 is a block diagram for describing the internal constitution of the control part 60.

The control part 60 is constituted of an ordinary-type computer where a CPU 61, a ROM 62, a RAM 63, a storage device 64 and the like are connected to each other via a bus line 65, for example, as shown in FIG. 11. The ROM 62 stores a basic program and the like therein, and the RAM 63 is provided as a work area used when the CPU 61 performs predetermined processing. The storage device 64 is formed of a flash memory or a non-volatile storage device such as a hard disc device. The storage device 64 stores a processing program P0 and a schedule preparation program P1 therein. Since the CPU 61 executes arithmetic processing described later in accordance with steps written in the schedule preparation program P1, schedule data (hereinafter referred to as "SD") for each of the substrates W to be processed is prepared in the form of a table in a chronological order arrangement, or the like. The prepared schedule data SD is stored in the storage device 64. As the CPU 61 executes arithmetic processing in accordance with steps written in the processing program P0, various functions of the substrate processing apparatus 1 can be realized and hence, predetermined cleaning processing can be applied to the substrates W to be processed in accordance with the above-described schedule data DS.

In the control part 60, an input part 66, a display part 67 and a communication part 68 are also connected to the bus line 65. The input part 66 is formed of various kinds of switches, a touch panel and the like, and receives various input setting instructions such as a processing recipe from an operator. The display part 67 is formed of a liquid crystal display device, a lamp or the like, and displays various information under a control of the CPU 61.

The communication part 68 has a data communication function via LAN or the like.

To the control part 60, the indexer robot IR, the center robot CR, the IR moving mechanism 5, the CR moving mechanism 17, the front surface cleaning processing part 11, the back surface cleaning processing part 12, the reverse unit RT1, and the reverse and transfer unit RT2 are connected as controlled objects. The detailed description of the schedule preparation program P1 is made after the manner of operation of the substrate processing apparatus 1 is explained.

<2. Manner of Operation of Substrate Processing Apparatus 1>

The constitutions of the devices of the substrate processing apparatus 1 and the manner of operation of the devices (the cleaning processing, the reversing processing and the like) have been described heretofore.

Hereinafter, the description is made with respect to the transfer operation of the substrate W between each of the devices (the substrate placing parts PASS, the reverse unit RT1, the reverse and transfer unit RT2, the cleaning processing units SS (SSR) and the like) and the indexer robot IR and the center robot CR in the inside of the substrate processing apparatus 1, and the substrate processing operation through the whole substrate processing apparatus 1. These operations are performed in accordance with the schedule data SD prepared by the schedule preparation program P1. Hereinafter, the individual operations are described firstly, and the preparation principle of the schedule data SD and a comprehensive timing control based on the schedule data SD are described in detail later.

<2.1 Transfer Operation of Substrate W>

As described previously, the indexer robot IR and the center robot CR each include the moving mechanism, the turning mechanism, the elevating/lowering mechanism, and the extending and retracting mechanism, and each of the hands of the robots are allowed to get access to each of the elements in the inside of the substrate processing apparatus 1.

Figure 14A:
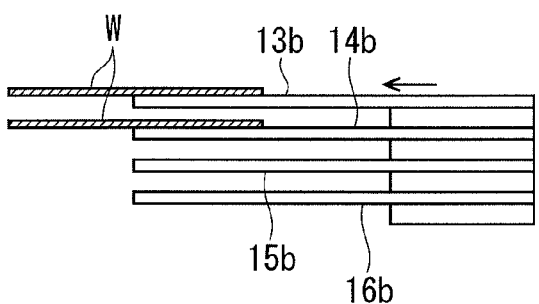
FIGS. 14A to 14C are conceptual views for describing a substrate transfer operation between the center robot CR and the relay unit 50a according to the first preferred embodiment.
Figure 14B:
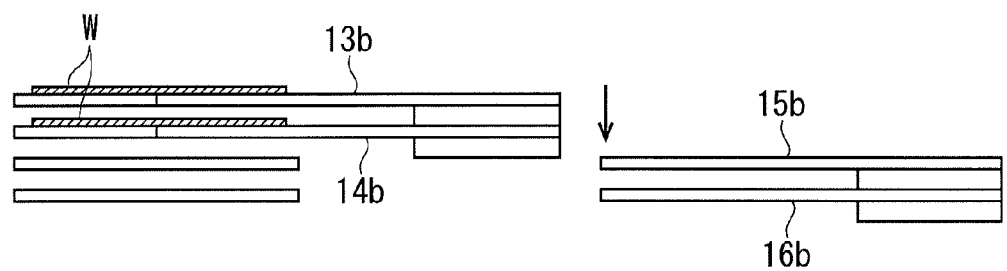
Figure 14C:
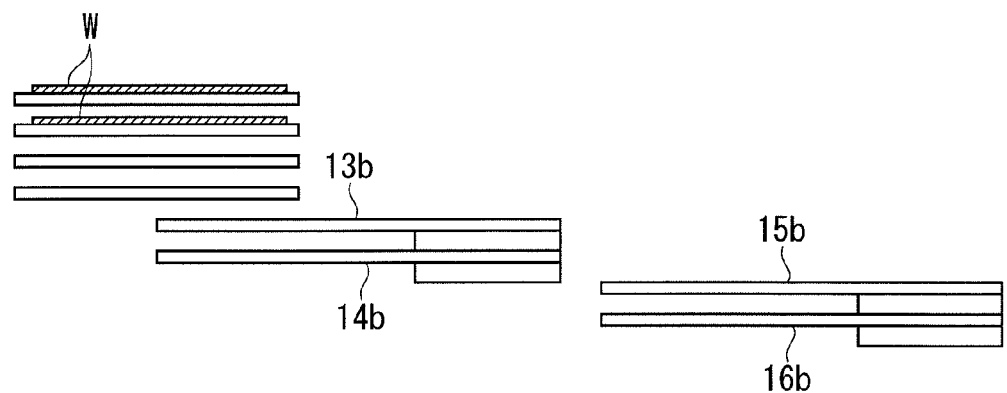

The substrate transfer operation performed using such mechanisms is described by taking the case where the center robot CR gets access to the front surface cleaning processing units SS and the case where the center robot CR gets access to the relay part 50 as examples. FIG. 12A to FIG. 12D and FIG. 13A to FIG. 13D are schematic views showing one example of the substrate transfer operation between the center robot CR and the front surface cleaning processing units SS. FIG. 14A to FIG. 14C are schematic views showing the substrate transfer operation between the center robot CR and the PASS (relay part 50). To facilitate the understanding of the drawings, the substrate transfer operation is expressed in a simplified manner by describing only the substrates W, the support members 54 of the substrate placing parts PASS1 to PASS4, and the hands 13b to 16b.

[Access Between Center Robot CR and Processing Units]

As shown in FIG. 12A, a processed substrate W1 is placed on the spin chuck 111 of the processing unit SS. The slit 116 of the processing unit SS is slid so that the gate 117 is opened.

When the center robot CR conveys out the processed substrate W1 from the front surface cleaning processing unit SS, firstly, the control part 60 controls the turning mechanism 31 so that the hand 13b is allowed to face the front surface cleaning processing unit SS in an opposed manner. Simultaneously, the control part 60 adjusts the position of the hand 13b in height such that the upper surface of the hand 13b is positioned below an upper surface of the spin chuck 111, and the lower surface of the hand 13b is positioned above the upper surface of the rotation support portion 114 (see FIG. 12A) by controlling the elevating/lowering mechanism 32.

Next, the control part 60 extends the arm 13a by controlling the extending and retracting drive mechanism 29. Due to such a control, the hand 13b moves horizontally and enters the inside of the front surface cleaning processing unit SS, the member pass-through region on a distal end of the hand 13b pass through the spin chuck 111, and the hand 13b is arranged below the substrate W1 which is held by the spin chuck 111 as shown in FIG. 12B. The hands 13b to 16b of the present preferred embodiment are individually extensible and retractable and hence, it is possible to allow only the hand necessary for the substrate conveying operation and the substrate conveying-out operation (in FIG. 12B, the hand 13b) to enter the inside of the unit case 115 of the front surface cleaning processing unit SS. Accordingly, an amount of particles which the hands 13b to 16b may bring into the inside of the unit case 115 can be minimized. A vertical width of a space between the spin chuck 111 and the rotation support portion 114 may be narrowed to an extent where only one hand out of the hands 13b to 16b can enter the space.

Thereafter, the control part 60 elevates the hand 13b by controlling the elevating/lowering mechanism 32. Due to such an operation, as shown in FIG. 12C, the substrate W1 which is placed on the spin chuck 111 is transferred to an upper side of the hand 13b. Subsequently, the control part 60 allows the arm 13a to retract by controlling the extending and retracting drive mechanism 29. Due to such an operation, as shown in FIG. 12D, the hand 13b is retracted from the front surface cleaning processing unit SS. In the series of operations described above, the description is made with respect to the case where one piece of substrate W is conveyed out from any one of the front surface cleaning processing units SS using the hand 13b. However, also when other substrate holding hands 14b to 16b are used, it is possible to perform the substantially same conveyance operation provided that a height of the hand is changed by the elevating/lowering mechanism 32 such that the operation condition is set equal to the operation condition of the above-mentioned operation where 1 piece of substrate is conveyed out.

Subsequently, the substrate conveying-in operation is described. The control part 60 elevates the arm 15a to a height where a non-processed substrate W2 which is held on an upper surface of the hand 15b is positioned above the spin chuck 111 by controlling the elevating/lowering mechanism 32 (FIG. 13A).

Next, the control part 60 controls the elevating/lowering mechanism 29 such that the arm 15a extends. Due to such an operation, the hand 15b moves horizontally and enters the inside of the front surface cleaning processing unit SS, and as shown in FIG. 13B, the substrate W2 which is held on an upper side of the hand 15b is arranged above the spin chuck 111.

Thereafter, the control part 60 controls the elevating/lowering mechanism 32 such that the hand 15b is lowered. Due to such an operation, as shown in FIG. 13C, the substrate W2 which is held by the hand 15b is transferred to the spin chuck 111. Then, the control part 60 allows the arm 15a to retract by controlling the extending and retracting drive mechanism 29. Due to such an operation, as shown in FIG. 13D, the hand 15b is retracted from the front surface cleaning processing unit SS. In the series of operations described above, the description is made with respect to the case where one piece of substrate W is conveyed in the front surface cleaning processing unit SS using the hand 15b. However, such one piece of substrate conveying operation is also applicable to the case where one piece of substrate W is conveyed in the back surface cleaning processing unit SSR in the same manner.

When the hand 15b is lowered, as shown in FIGS. 13B, 13C, there exists a timing at which the hand 15b overlaps with the spin chuck 111 as viewed in a side view (as viewed in the horizontal direction). However, as described previously, the hand 15b is formed into a bifurcated fork shape and hence, at this point of time, the spin chuck 111 enters the inside of the substrate holding hand 15b and hence, there is no possibility that the spin chuck 111 interferes with the hand 15b. In the same manner, also in the substrate transfer operation between the support pins of the substrate placing part PASS and the reverse unit RT1, and each of the hands, it is designed such that although there exists a timing at which the support pins and each of the hands overlap with each other as viewed in a side view (as viewed in the horizontal direction), there is no possibility that the support pins and each of the hands interfere with each other.

[Access Between Center Robot CR and Relay Part 50]

FIG. 14A to FIG. 14C are schematic views for describing one example of an operation when two substrates W are simultaneously conveyed in the substrate placing parts PASS1, PASS2 using the center robot CR.

When two substrates W are simultaneously conveyed in the substrate placing parts PASS1, PASS2 using the center robot CR, for example, in a state where the substrates W are held by the hands 13b, 14b on a one-by-one basis, two substrates W are simultaneously conveyed in the substrate placing parts PASS1, PASS2 (two-substrates conveying operation). To be more specific, the control part 60 allows the hands 13b, 14b to face the substrate placing parts PASS1, PASS2 in an opposed manner respectively by controlling the turning mechanism 9 and the elevating/lowering mechanism 10. At this point of time, as shown in FIG. 14A, the hands 13b, 14b are elevated or lowered to a height where the two substrates W held by the hands 13b, 14b respectively are arranged above the substrate placing parts PASS1, PASS2.

As described previously, the distance in the vertical direction between the upper and lower substrate support positions in the substrate placing parts PASS1 to PASS4 is set equal to the distance in the vertical direction between the two substrates W held by each of the hands 13b, 14b of the center robot CR. Accordingly, by arranging the substrate W held by the hand 13b such that the substrate W is positioned above the substrate placing part PASS1 by operating the elevating/lowering mechanism 10, the substrates W held by the other hands 14b can be also arranged above the substrate placing part PASS2, respectively.

Next, the control part 60 controls the extending and retracting drive mechanism 8 such that the arm 13a and the arm 14a extend simultaneously. Due to such an operation, the hands 13b, 14b enter the inside of the substrate placing parts PASS1, PASS2 respectively, and as shown in FIG. 14B, two substrates W respectively held by the hands 13b, 14b are arranged above the substrate placing parts PASS1, PASS2.

Thereafter, the control part 60 controls the elevating/lowering mechanism 10 such that the hands 13b, 14b are lowered until the two substrates W are supported on the substrate placing parts PASS1, PASS2. Due to such an operation, as shown in FIG. 14C, the substrates W are simultaneously placed on the support pins 55 in the substrate placing parts PASS1, PASS2 not shown in the drawing and hence, the two substrates W are simultaneously transferred to the substrate placing parts PASS1, PASS2 respectively from the center robot CR. Then, the control part 60 controls the extending and retracting drive mechanism 29 such that the arm 13a and the arm 14a retract simultaneously. Due to such an operation, the hands 13b, 14b are retracted from the substrate placing parts PASS3, PASS4 (two-substrates conveying operation). Although the description using drawings is omitted, when the center robot CR simultaneously conveys out two non-processed substrates W from the substrate placing parts PASS3, PASS4, the previously-mentioned series of operations are performed in on reverse manner. That is, the hands 15b, 16b are made to extend to areas below the substrate placing parts PASS3, PASS4 respectively. Next, the hands 15b, 16b are elevated and, subsequently, the arm 15a and the arm 16a are retracted simultaneously so that the two substrates W can be simultaneously conveyed out from the substrate placing parts PASS1, PASS2 using the hands 15b, 16b (two-substrates conveying-out operation).

Although the two-substrates conveying-in operation and the two-substrates conveying-out operation of the substrates W between the center robot CR and the substrate placing parts PASS have been described heretofore, the series of such operations is substantially equal to the operations performed in the transfer of the substrates W between the center robot CR and other units. To be more specific, the two-substrates conveying-in operation and the two-substrates conveying-out operation described above can be performed in the transfer of the substrates W between the center robot CR and the reverse unit RT1, the transfer of the substrates W between the indexer robot IR or the center robot CR and the reverse and transfer unit RT2, the transfer of the substrates W between the indexer robot IR and the substrate placing parts PASS, and the transfer of the substrates W between the indexer robot IR and the carriers C.

Each of the hands of each robot (CR or IR) according to the present preferred embodiment are used differently depending on whether the substrate W which the hand holds is the non-processed substrate to which cleaning processing is not yet applied or the processed substrate to which cleaning processing has been already applied. In view of the above, although the conveying-in operation and the conveying-out operation of the processed substrate W can be performed using the hands 7b, 7c and the hands 15b, 16b which are hands for holding the non-processed substrates in principle of the conveying-in operation and the conveying-out operation described previously, in the present preferred embodiment, the hands 7b, 7c and the hands 15b, 16b are not used in the conveying-in operation and the conveying-out operation of the processed substrate W. The same goes for the hands 6b, 6c and the hands 13b, 14b which are hands for holding the processed substrates.

When the center robot CR holds the plurality of substrates W, there may be a case where the center robot CR conveys the substrates W in the plurality of cleaning processing units SS (or SSR) in sequence on a one-by-one basis. In the same manner, there may be a case where the center robot CR conveys out the substrates W from the plurality of cleaning processing units SS (or SSR) on a one-by-one basis. In these cases, to focus on only the relationship between the individual processing unit SS (SSR) and the center robot CR, although the one-piece substrate conveying-in operation or the one-piece substrate conveying-out operation is performed, to consider the relationship between the cleaning processing part 11 (or 12) which is the collective body formed of the plurality of cleaning processing units SS (SSR) and the center robot CR, it is considered that the two-substrates conveying operation or the two-substrates conveying-out operation is performed. Accordingly, in the present specification, the description is made hereinafter assuming that the two-substrates conveying-in (conveying-out) operation is performed in the case where the center robot CR which holds a plurality of substrates W conveys the plurality of substrates W in the plurality of cleaning processing units SS (SSR) in order and also in the case where the center robot CR conveys out the plurality of substrates W from the plurality of cleaning processing units SS (SSR) and moves to another segment in the same manner as the case where the center robot CR gets access to the relay part 50 and performs the two-substrate conveying-in (conveying-out) operation.

<2.2 Patterns of Substrate Processing>

Here, patterns of substrate processing which can be performed by the substrate processing apparatus 1 are described.

In the substrate processing apparatus 1, various substrate processing patterns such as "only front surface cleaning", "only back surface cleaning", "both surface cleaning (back surface to front surface)", "both surface cleaning (front surface to back surface)" and the like can be selectively applied to the substrate W.

In the pattern "only front surface cleaning", after the substrate W is conveyed out from the carrier C, the cleaning processing of the front surface of the substrate W is performed without reversing the front surface and the back surface of the substrate W. After the cleaning of the substrate W, the substrate W is returned to the carrier C without reversing the front surface and the back surface of the substrate W. In the pattern "only back surface cleaning", after the substrate W is conveyed out from the carrier C, the cleaning processing of the back surface of the substrate W is performed after reversing the front surface and the back surface of the substrate W. After the substrate W is cleaned, the substrate W is returned to the carrier C after reversing the front surface and the back surface of the substrate W. In the pattern "both surface cleaning (back surface to front surface)", after the substrate W is conveyed out from the carrier C, the cleaning processing of the back surface of the substrate W is performed after reversing the front surface and the back surface of the substrate W. Thereafter, the front surface and the back surface of the substrate W are reversed so as to bring the substrate W into a state where the front surface of the substrate W faces upward, and the cleaning processing of the front surface of the substrate W is performed. Thereafter, the substrate W is returned to the carrier C without reversing the front surface and the back surface of the substrate W. In the pattern "both surface cleaning (front surface to back surface)", after the substrate W is conveyed out from the carrier C, the cleaning processing of the front surface of the substrate W is performed without reversing the front surface and the back surface of the substrate W. Thereafter, the front surface and the back surface of the substrate W are reversed so as to bring the substrate W into a state where the back surface of the substrate W faces upward, and the cleaning processing of the back surface of the substrate W is performed. Thereafter, the substrate W is returned to the carrier C after reversing the front surface and the back surface of the substrate W.

A series of processing applied to the substrate W by the substrate processing apparatus 1 can be divided into a plurality of segments S1 to S1 as shown in FIG. 15.

The segments S1, S1 correspond to stages where the substrate W is stored in the carrier C. The segments S1, S1 correspond to stages where the substrate W is conveyed within the indexer section 2 by the indexer robot IR. The segments S3, S7, S11 correspond to stages where the substrate W is stored in the relay part 50. The segments S5, S9 correspond to stages where the substrate W is processed in the processing section 3. The segments S4, S6, S8, S10 correspond to stages where the substrate W is conveyed within the processing section 3 by the center robot CR.

As shown in FIG. 15, the conveyance destination of the substrate W in each segment may differ corresponding to a conveyance pattern of the substrate W. For example, in the segment S3, in case of a pattern "cleaning only front surface" and a pattern "both surface cleaning (front surface to back surface)", the substrate W is conveyed to the substrate placing part PASS of the relay processing unit 50a. In case of a pattern "only cleaning back surface" and a pattern "both surface cleaning (back surface to front surface)", the substrate W is conveyed to the reverse and transfer unit RT2. In the segment S5, in case of a pattern "only front surface cleaning" and a pattern "both surface cleaning (front surface to back surface)", the substrate W is conveyed to any one of the front surface cleaning processing units SS1 to SS8. In case of a pattern "only back surface cleaning" and a pattern "both surface cleaning (back surface to front surface)", the substrate W is conveyed to any one of the back surface cleaning processing units SSR1 to SSR8. In the segment S7, in case of a pattern "both surface cleaning (back surface to front surface)" and a pattern "both surface cleaning (front surface to back surface)", the substrate W is conveyed to the reversing processing unit RT1. In the segment S9, in case of a pattern "both surface cleaning (back surface to front surface)", the substrate W is conveyed to any one of the front surface cleaning processing units SS1 to SS8. On the other hand, in case of a pattern "both surface cleaning (front surface to back surface)", the substrate W is conveyed to any one of the back surface cleaning processing units SSR1 to SSR8. In the segment S11, in case of a pattern "only front surface cleaning" and a pattern "both surface cleaning (back surface to front surface)", the substrate W is conveyed to the substrate placing part PASS of any one of the relay processing units 50a. In case of the pattern "only back surface cleaning" and a pattern "both surface cleaning (front surface to back surface)", the substrate W is conveyed to the reverse and transfer unit RT2.

Further, in FIG. 15, handling of the substrate W in the meshed segments (S1, S3, S5, S7, S9, S11, and S1) is determined in the flow recipe FR.

The substrate processing pattern is specifically described hereinafter.

With respect to the segments S1 and S1, the flow recipe FR defines a slot position of the carrier C where the substrate W is stored. With respect to the segments S7 and S11, the flow recipe FR defines to which unit the substrate W to be processed is conveyed out of the relay unit 50a, the reverse unit RT1 and the reverse and transfer unit RT2. With respect to the segments S5, S7 and S9, the flow recipe FR defines to which processing unit the substrate W to be processed is conveyed out of front surface cleaning processing units SS1 to SS8 and the back surface cleaning processing units SSR1 to SSR8

<3. Schedule Preparation Program P1>

Hereinafter, the schedule preparation program P1 is described. As shown in FIG. 11, the schedule preparation program P1 is a program stored in a storage device 64 in the control part 60. The schedule preparation program P1 is a program for preparing schedule data SD of the substrates which become objects to be processed by being executed by a CPU 61 which performs various arithmetic operations. The schedule data SD prepared in this manner is stored in the storage device 64. When the CPU 61 executes arithmetic operations in accordance with steps described in a processing program P0, various functions of the substrate processing apparatus 1 are realized, and predetermined cleaning processing is applied to the object substrate W in accordance with the above-mentioned schedule data SD.

<3.1 Plan Logic in Preparation of Schedule>

Figure 16:
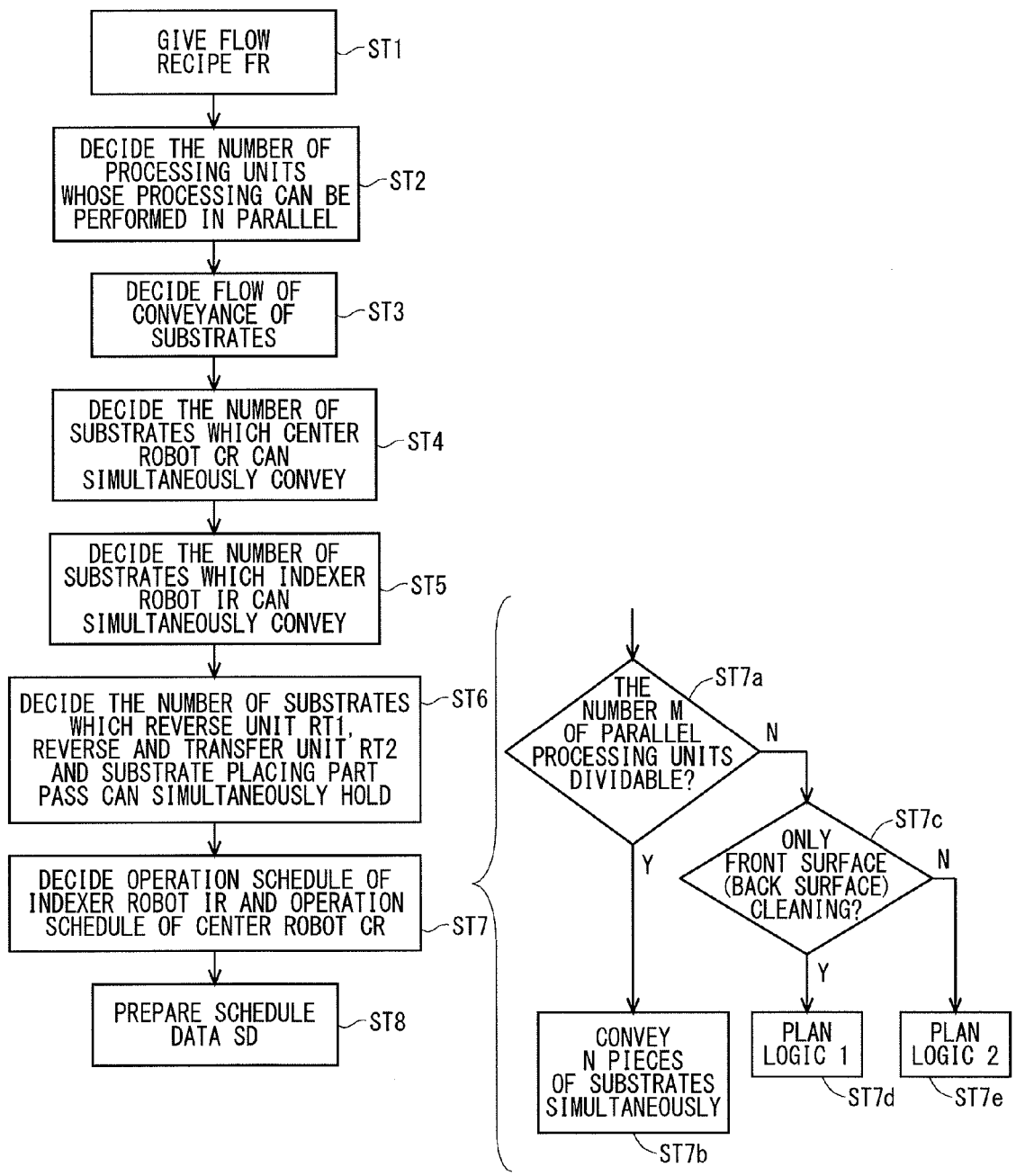
FIG. 16 is a flowchart for describing a schedule data preparation method according to the first preferred embodiment.

FIG. 16 is a flowchart showing the flow of preparation of the schedule data SD by the schedule preparation program P1 according to the first preferred embodiment of the present invention. Firstly, a flow recipe FR is given to the schedule preparation program P1 with respect to a plurality of (for example, an amount corresponding to 1 lot) substrates W (step ST1). The schedule preparation program P1 decides the number of processing units to which processing in parallel (also referred to as parallel processing) can be performed (also referred to as parallel processing unit number) in the first-time cleaning processing segment S5 and in the second-time cleaning processing segment S9 (step ST2).

As described previously, the flow recipe FR decides which one of the front surface cleaning processing units SS1 to SS8 and the back surface cleaning processing units SSR1 to SSR8 is to be used in the segment S5 and the segment S9. Accordingly, the schedule preparation program P1 can decide the number of processing units whose processing can be performed in parallel (parallel processing unit number) in the segment S5 where the first-time cleaning processing is performed and in the segment S9 where the second-time cleaning processing is performed based on such information. For example, when the flow recipe FR defines only the front surface cleaning processing unit SS1 as the front surface cleaning processing units to be used in the segment S5, the parallel processing unit number in the segment 5 becomes "1". On the other hand, when the flow recipe FR defines all front surface cleaning processing units SS1 to SS8 as the front surface cleaning processing units to be used in the segment S5, the parallel processing unit number in the segment 5 becomes "8". In the same manner, when the flow recipe FR defines only the specified back surface cleaning processing unit SSR1 with respect to the segment S5, the parallel processing unit number in the segment T5 becomes "1". When the flow recipe FR defines all back surface cleaning processing units SSR1 to SSR8 with respect to the segment S5, the parallel processing unit number in the segment 5 becomes "8". Based on the same understanding, the number of processing units whose processing can be performed in parallel (parallel processing unit number) in the segment 9 where the second-time cleaning processing is performed is decided based on the flow recipe FR.

In the description made hereinafter, the number of processing units whose processing can be performed in parallel in the first-time cleaning processing is referred to as M (M1 in case both surface cleaning is performed). The number of processing units whose processing can be performed in parallel in the second-time cleaning processing is referred to as M2.

The schedule preparation program P1 decides the flow of the conveyance of the substrates as follows based on the above (step ST3). In the description made hereinafter, the flow of the conveyance of the substrates is expressed by describing both the type and the number of processing units subjected to parallel processing in the segment S5 and both the type and the number of processing units subjected to parallel processing in the segment S9 are indicated together such as "back 3 parallel-front 4 parallel". When cleaning processing is performed only in the segment S5 and is not performed in the segment S9, the flow of the conveyance of the substrates is expressed by the type and the number of processing units subjected to parallel processing in the segment S5 such as "back 8 parallel".

Figure 17:
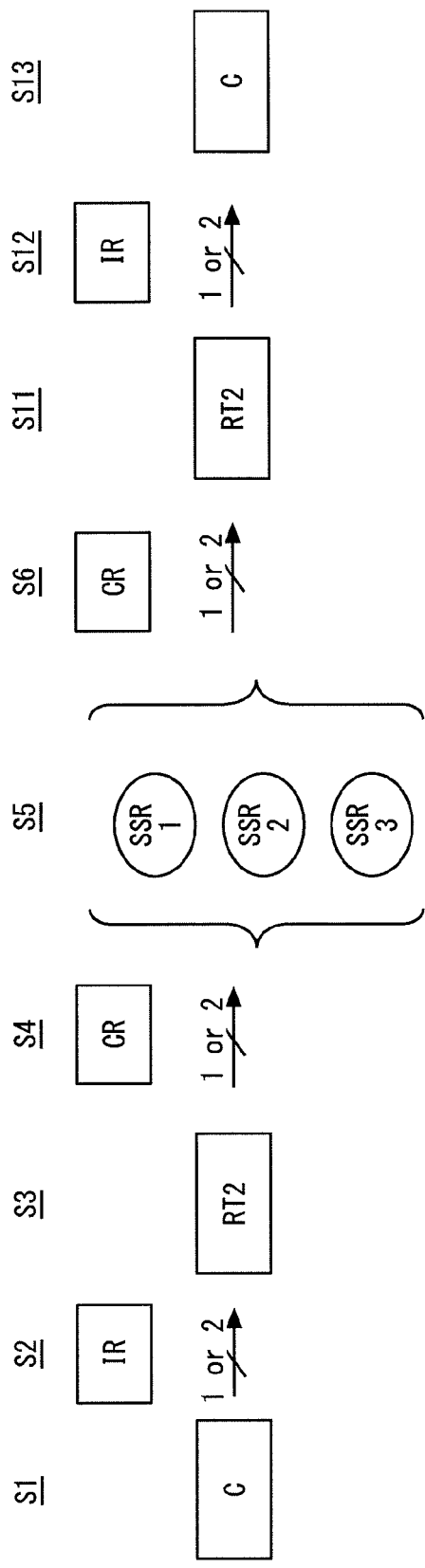
FIG. 17 is a schematic view for describing the flow of substrates when the substrates are conveyed in a pattern of "back-3-parallel" in the first preferred embodiment.

In the pattern "only back surface cleaning" described previously, when the cleaning processing units are operated in accordance with "back 3 parallel", the substrate W is conveyed as shown in FIG. 17. A plurality of substrates W are sequentially conveyed toward the reverse and transfer unit RT2 from the carrier C by the indexer robot IR (segment S1). The substrate W which is conveyed to the reverse and transfer unit RT2 by the indexer robot IR is sequentially conveyed to three back surface cleaning processing units SSR1 to SSR3 by the center robot CR (segment S4). The back surface cleaning processing units SSR1 to SSR3 perform cleaning processing of three substrates W in parallel (segment S5). After cleaning processing of the three substrates W in the back surface cleaning processing units SSR1 to SSR3 is finished, the substrates W are sequentially conveyed toward the reverse and transfer unit RT2 by the center robot CR (segment S6). The substrates W which are conveyed to the reverse and transfer unit RT2 are sequentially conveyed toward the carrier C from the reverse and transfer unit RT2 by the indexer robot IR (segment S12).

Figure 18:
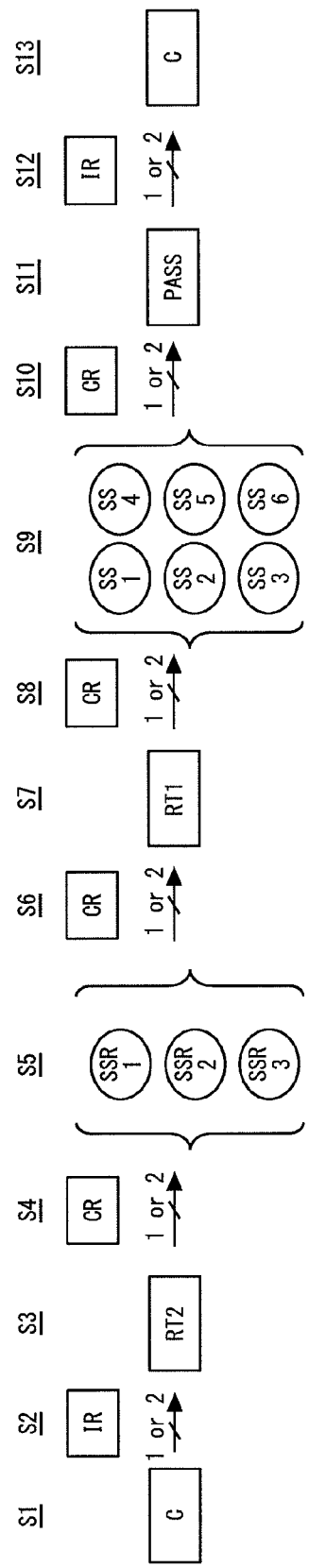
FIG. 18 is a schematic view for describing the flow of substrates when the substrates are conveyed in a pattern of "back-3-parallel and front-6-parallel" in the first preferred embodiment.

In the pattern "both surface cleaning (back surface to front surface)" described previously, when the processing units are operated in accordance with "back 3 parallel-front 6 parallel", the substrate W is conveyed as shown in FIG. 18. Since processing from the segment S2 to the segment S5 in the pattern "both surface cleaning" is equal to the processing from the segment S2 to the segment S5 in the pattern "only back surface cleaning", the explanation of the latter processing is omitted.

The substrates W whose cleaning processing by the back surface cleaning processing units SS1 to SSR is finished are sequentially conveyed toward the reverse unit RT1 by the center robot CR (segment S6). After the reverse processing is performed, the substrates W which are conveyed to the reverse unit RT1 are sequentially conveyed toward 6 pieces of front surface cleaning processing units SS1 to SS6 by the center robot CR (segment S8). The front surface cleaning processing units SS1 to SS6 perform cleaning processing of the 6 substrates W in parallel (segment S9). The substrates W whose cleaning processing by the front surface cleaning processing units SS1 to SS6 is finished are sequentially conveyed toward the substrate placing part PASS of the relay unit 50a by the center robot CR (segment S10). The substrates W which are placed on the substrate placing part PASS are sequentially conveyed toward the carrier C by the indexer robot IR (segment S1).

In this manner, in the segments S1, S4, S6 and S1 in "back 3 parallel", it is necessary that three substrates W are sequentially conveyed. In "back 3 parallel-front 6 parallel", it is necessary that three substrates W in the segments S1, S4 and S6 and six substrates W in the segments S8, S10 and S12 are sequentially conveyed respectively. However, only two non-processed substrates W can be simultaneously conveyed by the indexer robot IR and the center robot CR. In the same manner, the reverse unit RT1, the reverse and transfer unit RT2 and the substrate placing part PASS can simultaneously hold only two non-processed substrates W. Accordingly, operations of the indexer robot IR and the center robot CR in these segments are important.

Let us return to the explanation of FIG. 16. When the flow of the conveyance of the substrates is decided in the above-mentioned manner (step ST3), the number of the substrates W which the center robot CR can simultaneously convey is decided (step ST4). As described above, the number of the substrates W which the center robot CR can simultaneously convey is "2" and hence, in step ST4, "2" is generally designated. However, there may be a case where the hand 13 which is a part of the center robot CR cannot be used attributed to the malfunction of the center robot CR or the like. Accordingly, in step ST4, there is a possibility that, "1" or "2" is designated as the number of the substrates W which can be simultaneously conveyed. In general, when it is configured that the center robot CR can simultaneously convey X sheets or less (X being 1 or more) of the substrates W, in step ST4, there is a possibility that a natural number equal to or less than X is designated. Further, in the present preferred embodiment, the hands of the center robot CR are properly used in such a manner that, out of the four hands 13b to 16b of the center robot CR, the hands 13b and 14b are used for the non-processed substrates and the hands 15b and the 16b are used for the processed substrates and hence, the number of the non-processed substrates W or the processed substrates W which the center robot CR can simultaneously convey is "1" or "2". However, when the hands 13b to 16b are not properly used in this manner, the number of the non-processed substrates W or the processed substrates W which the center robot CR can simultaneously convey becomes "1", "2", "3" or "4". In the similar way of thinking, the number of the substrates W which the indexer robot IR can simultaneously convey is specified (step ST5).

Next, the number of the substrates W which the reverse unit RT1, the reverse and transfer unit RT2 and the substrate placing part PASS can simultaneously hold is specified (step ST6). As described previously, the number of the substrates W which the reverse unit RT1, the reverse and transfer unit RT2 and the substrate placing part PASS can simultaneously hold is "2" and hence, in step ST6, "2" is generally designated. However, there may be a case where the reverse unit RT1, the reverse and transfer unit RT2 and the substrate placing part PASS can hold only one piece of substrate W attributed to the malfunction of the reverse unit RT1, the reverse and transfer unit RT2 or the substrate placing part PASS. Accordingly, in step ST6, there is a possibility that "1" or "2" is specified as the number of pieces of substrates W which can be simultaneously held. In general, when it is configured that the reverse unit RT1, the reverse and transfer unit RT2 and the substrate placing part PASS can simultaneously convey Y sheets or less (Y being 1 or more) of the substrates W, in step ST6, there is a possibility that a natural number equal to or less than Y is designated.

Next, the schedule preparation program P1 prepares operation schedules of the indexer robots IR in the segments S2 and S1, and operation schedules of the center robots CR in the segments S4, S6, S8 and S10 (step ST7). The schedule preparation program P1 prepares the operation schedules of the indexer robots IR in the segments S2 and S12 and the operation schedules of the center robots CR in the segments S4, S6, S8 and S10 in accordance with steps ST7a to ST7e which are sub steps of step ST7.

In step ST7a, it is determined whether or not the number M of parallel processing units (M1 and M2 in case of performing both surface cleaning) at the conveyance destination of the indexer robot IR or the center robot CR can be divided by the number (N) of the substrates W which can be simultaneously conveyed by the robot IR or CR. In other words, in step ST7a, it is determined whether or not N becomes a devisor of M (M1 and M2 in case of both surface cleaning) which is the number of parallel processing units. When the determination is "Yes" in step ST7a, the indexer robot IR or the center robot CR simultaneously conveys N pieces of substrates W to the processing unit SS or SSR (step ST7b). On the other hand, the determination in step ST7a is "No", the processing advances to step ST7c, and it is determined whether the substrate conveyance pattern to be performed is "only front surface cleaning" or "only back surface cleaning". Then, when the determination in step ST7c is "Yes", the operation schedule of the indexer robot IR or the operation schedule of the center robot CR is decided in accordance with the following plan logic 1 (step ST7d). On the other hand, when the determination in step ST7c is "No", the operation schedule of the center robot CR is decided in accordance with the following plan logic 2 (step ST7e).

[Plan logic 1] When the center robot CR conveys the substrates W between two segments, the operation schedule of the center robot CR is prepared such that a cycle constituted of the following steps SS11 and SS12 is repeated.

SS11: The center robot CR performs the simultaneous conveyance of N pieces of substrates W the number of times which is a quotient obtained by dividing M by N.

SS22: The center robot CR simultaneously conveys the substrates W whose number is a remainder obtained by dividing M by N in the substrate conveyance of "the number of times which is a quotient obtained by dividing M by N"+1"-th time.

Here, M is the number of parallel processing units at the substrate destination of the center robot CR or the number of substrates W that the center robot CR can hold simultaneously (also referred to as simultaneous substrate holding number). N is the number of substrates W which can be simultaneously conveyed by the center robot CR.

[Plan logic 2] When the center robot CR sequentially conveys 1 piece of substrate W to the plurality of processing units as in the case of "back 3 parallel-front 6 parallel", the operation schedule of the center robot CR is prepared such that a cycle constituted of the following sub steps SS21 and SS22 is repeated.

SS21: The center robot CR performs the simultaneous conveyance of N pieces of substrates W only the number of times which is a quotient obtained by dividing "the greatest common divisor of M1 and M2" by N.

SS22: The center robot CR simultaneously conveys the substrates W the number of which is "a remainder obtained by dividing "the greatest common divisor of M1 and M2" by N" in the substrate conveyance of "M3+1"-th time.

Here, M1 is the number of processing units which perform parallel processing in the first-time cleaning processing, M2 is the number of the processing units which perform parallel processing in the second-time cleaning processing, and N is the number of substrates W which can be simultaneously conveyed by the center robot CR.

In the manner described above, the operation schedule of the center robots CR in the segments S4, S6, S8 and S10 is decided by the schedule preparation program P1. Then, the operation schedule of the indexer robots IR is prepared in conformity with the operation schedules of the center robots CR. Lastly, the schedule preparation program P1 integrates the substrate conveyance schedules of each of the robots, the substrate processing schedules at each of the cleaning processing units SS and SSR, the substrate reversing schedules at the reverse unit RT1 and the reverse and transfer unit RT2 and the like, thus preparing the final schedule data SD (step ST8).

<3.2 Application Example of Plan Logic 1>

Hereinafter, one example of the conveyance schedule prepared based on the plan logic 1 is explained.

When the plan logic 1 is applied to the movement of the center robot CR in the segment S4 in the "back 3 parallel" pattern (see FIG. 17), the center robot CR repeatedly performs a cycle constituted of the following sub steps SS11 and SS12.

(Sub step SS11) The center robot CR performs the simultaneous conveyance of 2 pieces (that is, N pieces) of the substrates W toward two back surface cleaning processing units SSR from the reverse and transfer unit RT2 by one time (that is, the number of times which is a quotient obtained by dividing 3 by 2).

(Sub step SS12) The center robot CR conveys one piece (that is, the number of pieces which is a remainder obtained by dividing 3 by 2) of substrate W in the second-time (that is, the number of times which is obtained by adding one to a quotient obtained by dividing 3 by 2) substance conveyance.

Figure 19:
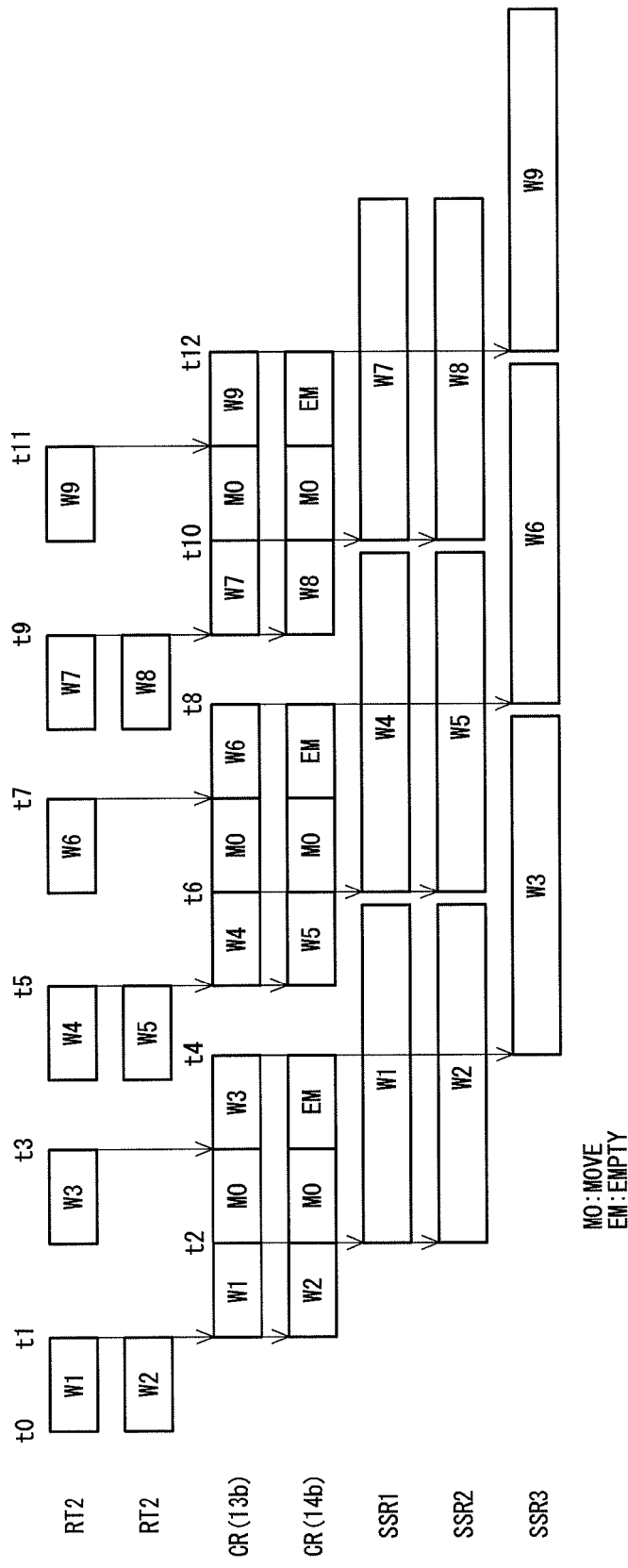
FIGS. 19 and 20 are time charts showing examples of a schedule prepared by the schedule logic according to the first preferred embodiment.

Due to such processing, a schedule shown in FIG. 19, for example, is prepared. FIG. 19 is a timing chart of the center robots CR and the back surface cleaning units SSR1 to SSR3 in the segment S4 and the segment S5 in the "back 3 parallel" pattern. In an actual operation, the center robot CR also performs conveying-out of the processed substrates W from the back surface cleaning units SSR1 to SSR3. However, in FIG. 19, to explain the processing by focusing on the conveyance cycle of non-processed substrates W from the reverse and transfer unit RT2 to the back surface cleaning units SSR1 to SSR3 and hence, the explanation of the processing is made by assuming that the conveying-out operation of the processed substrates W from the back surface cleaning units SSR1 to SSR3 is not performed.

Before a point of time t0 comes, two pieces of non-processed substrates W1, W2 are placed on the reverse and transfer unit RT2 by the indexer robot IR. Then, before a point of time t1 comes the substrates W1, W2 are reversed by the reverse and transfer unit RT2. The center robot CR simultaneously conveys out two pieces of non-processed substrates W1, W2 from the reverse and transfer unit RT2 at the point of time t1. The center robot CR moves 2 pieces of non-processed substrates W1, W2 to a position which faces the back surface conveyance processing unit SSR1 in an opposed manner while holding these non-processed substrates W1, W2 during a period from the point of time t1 to a point of time t2. The center robot CR conveys the non-processed substrate W1 into the back surface cleaning processing unit SSR1 at the point of time t2. Then, the back surface cleaning processing unit SSR1 starts application of back surface cleaning processing to the non-processed substrate W1. Next, the center robot CR moves to a position which faces the back surface cleaning processing unit SSR2 in an opposed manner. Then, the non-processed substrate W2 is conveyed in the back surface cleaning processing unit SSR2 at timing slightly delayed from the point of time t2. The back surface cleaning processing unit SSR2 starts application of the back surface cleaning processing to the non-processed substrate W2.

In FIG. 19, to simplify the explanation, the case is illustrated where the center robot CR simultaneously conveys two pieces of non-processed substrates W1, W2 into the back surface cleaning processing units SSR1 and SSR2 at the same point of time t2 (the same definition being applied to the succeeding processing).

Then, the center robot CR moves to a position which faces the reverse and transfer unit RP2 during a period up to a point of time t3. The third non-processed substrate W3 is placed on the reverse and transfer unit RT2 by the indexer robot IR and reversing of the non-processed substrate W3 in the reverse and transfer unit RT2 is completed by a point of time t3. The center robot CR takes out the third non-processed substrate W3 from the reverse and transfer unit RT2 at the point of time t3.

Then, the center robot CR moves one piece of substrate W3 to a position which faces the back surface cleaning processing unit SSR3 while holding the substrate W3 during a period from the point of time t3 to a point of time t4. Next, the center robot CR conveys one piece of non-processed substrate W3 into the back surface cleaning processing unit SSR 3 at the point of time t4. The back surface cleaning processing unit SSR3 starts application of back surface cleaning processing to the non-processed substrate W3.

Then, the center robot CR moves to a position which faces the reverse and transfer unit RT2 during a period from the point of time t4 to a point of time t5. Two pieces of non-processed substrates W4, W5 are placed on the reverse and transfer unit RT2 by the indexer robot IR and the reversing of the non-processed substrates W4, W5 in the reverse and transfer unit RT2 is completed by the point of time t5.

The center robot CR takes out the non-processed substrates W4, W5 from the reverse and transfer unit RT2 at the point of time t5. Subsequently, the center robot CR moves to a position which faces the back surface cleaning processing unit SSR1 during a period from the point of timet5 to a point of timet6. The center robot CR conveys the non-processed substrate W4 into the back surface cleaning processing unit SSR1. The back surface cleaning processing unit SSR1 starts application of back surface cleaning processing to the non-processed substrate W4. The center robot CR moves to a position which faces the back surface cleaning processing unit SSR2 in an opposed manner, and conveys the non-processed substrate W4 into the back surface cleaning processing unit SSR2 at a point of time slightly delayed from the point of timet6. The back surface cleaning processing unit SSR2 starts back surface cleaning processing to the non-processed substrate W5.

Then, the center robot CR moves to a position which faces the reverse and transfer unit RT2 in an opposed manner during a period up to a point of timet7. The sixth non-processed substrate W6 is placed on the reverse and transfer unit RT2 by the indexer robot IR and reversing of the substrate W6 by the reverse and transfer unit RT2 is completed up to the point of timet7. The center robot CR takes out the sixth non-processed substrate W6 from the reverse and transfer unit RT2 at the point of time t7.

Then, the center robot CR moves to a position which faces the back surface cleaning processing unit SSR3 in a state where one piece of substrate W6 is held during a period from the point of timet7 to a point of timet8. Next, the center robot CR conveys one piece of non-processed substrate W6 into the back surface cleaning processing unit SSR3 at the point of timet8. The back surface cleaning processing unit SSR3 starts application of back surface cleaning processing to the non-processed substrate W6.

As described above, the conveyance of the non-processed substrates W toward three back surface cleaning processing units SR1 to SR3 from the reverse and transfer unit RT2 is performed with a rhythm of 2-piece conveyance→1-piece conveyance→2-piece conveyance→1-piece conveyance . . . . With respect to the cycle of substrate conveyance, one cycle ranges from the point of time t1 to the point of time t4 (from the point of timet5 to the point of timet8).

In the example shown in FIG. 19, a time required for the substrate conveyance of 1 cycle is longer than a processing time at one piece of substrate processing unit and hence, a waiting time exists on a substrate processing unit side. Such a state is referred to as "conveyance rate-limiting". On the other hand, when a time required for the substrate conveyance of one cycle is shorter than a processing time in one substrate processing unit, a waiting time exists on a center robot CR side. Such a state is referred to as "process rate-limiting". In preparing an operation schedule where a plurality of substrates W are sequentially conveyed toward the processing unit SS or SSR from the center robot CR using a plurality of hands 13, 14 (or 15b, 16b), depending on the magnitude relationship between the conveyance time and the substrate processing time in the processing unit, any one of a conveyance rate-limiting state, a process rate-limiting state and a state where both the center robot CR and the processing unit are completely synchronized with each other occurs.

However, by preparing the operation schedule of the robot IR or CR in accordance with the plan logic 1, only one of "conveyance rate-limiting" and "process rate-limiting" is generated, and there is no possibility that "conveyance rate-limiting" and "process rate-limiting" are generated in mixture.

Further, as shown in FIG. 19, the substrates W are conveyed to all parallel processing units SSR1 to SSR3 within a period where the center robot CR performs a substrate conveyance cycle one time (for example, the period from the point of time t1 to the point of time t4, the period from the point of timet5 to the point of timet8 or the period from the point of timet9 to the point of timet12) or within a period integer times as long as such a period. As a result, the substrate processing in all parallel processing units SSR1 to SSR3 can be started within the period of 1 conveyance cycle (or a cycle integer times as large as such a period) by the center robot CR.

Accordingly, the cycle of the substrate conveyance by the center robot CR and the cycle of substrate processing start timing in the parallel processing unit advance in synchronization. By allowing the cycle of the substrate conveyance and the cycle at which the substrate processing starts to advance in synchronization, the substrate conveyance and the substrate processing advance with a constant rhythm whereby the stable substrate processing can be achieved. Accordingly, the operation schedule of the segment which performs such an operation schedule and the operation schedule of a segment before or after the segment can be smoothly connected to each other.

<3.3 Application Example of Plan Logic 2>

Hereinafter, one example of the conveyance schedule prepared based on the plan logic 2 is explained. When the plan logic 2 is applied to the movement of the center robots CR in the segments S4, S6 and S8 in the previously-mentioned "back 3 parallel-front 6 parallel" pattern using FIG. 18, the center robot CR repeatedly performs a cycle constituted of the following sub steps SS21 and SS22.

(Sub Step SS21)

The center robot CR performs the simultaneous conveyance of two pieces (that is, N pieces) of the substrates W toward two back surface cleaning processing units SSR from the reverse and transfer unit RT2 by one time (that is the number of times which is a quotient obtained by dividing the greatest divisor of M1 and M2 by N).

(Sub Step SS12)

The center robot CR conveys one piece of substrate W (that is, the remainder obtained by (the greatest divisor of M1 and M2 )/N pieces) in the second-time (that is, (a quotient obtained by dividing the greatest divisor of M1 and M2 by N)+1-th time).

Figure 20:
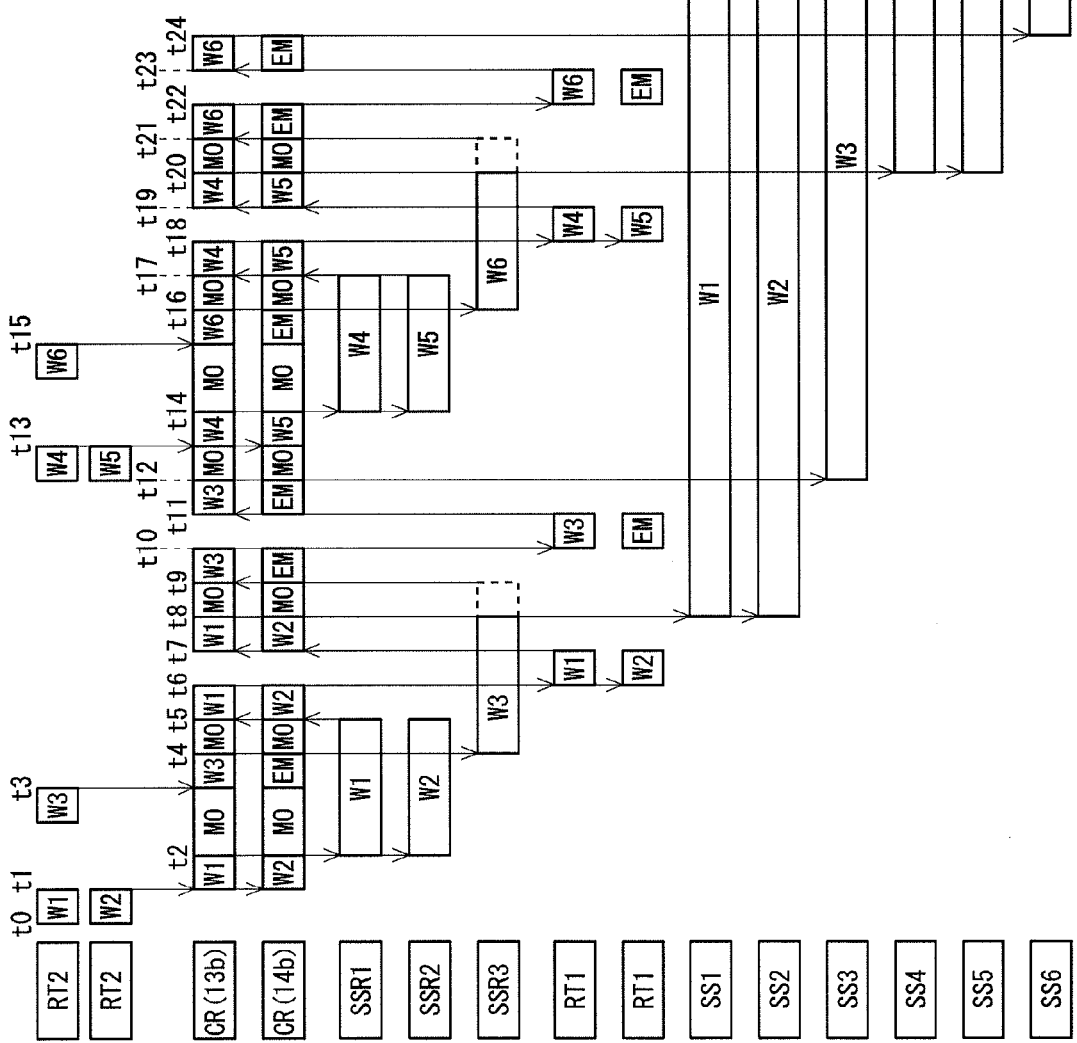

Due to such processing, a schedule shown in FIG. 20, for example, is prepared. FIG. 20 is a schematic view showing a holding state of the substrates W at respective timings in the reverse-and-transfer unit RT2, the center robots CR, the back surface cleaning processing units SSR and the front surface cleaning processing units SS when a plurality of substrates W are sequentially conveyed in the "back 3 parallel-front 6 parallel" pattern. FIG. 20 also explains a step of conveying out the substrates W from the back surface cleaning processing units SSR by the center robot CR.

Before a point of time t0 comes, two non-processed substrates W1, W2 are placed on the reverse and transfer unit RT2 by the indexer robot IR. Then, before a point of time t1 comes, the substrates W1, W2 are reversed by the reverse and transfer unit RT2. At the point of time t1, two substrates W1, W2 are simultaneously transferred to the center robot CR from the reverse and transfer unit RT2. From the point of time t1 to a point of time t2, the center robot CR which holds the substrates W1, W2 is moved to a position which faces the back surface cleaning processing unit SSR1 in an opposed manner. At a point of time t2, the substrate W1 is transferred to the back surface cleaning processing unit SSR1 from the center robot CR. Thereafter, cleaning processing of the back surface of the substrate W1 is started by the back surface cleaning processing unit SSR1. The center robot CR is moved to a position which faces the back surface cleaning processing unit SSR2 in an opposed manner. Then, the substrate W2 is transferred to the back surface cleaning processing unit SSR2 from the center robot CR. Thereafter, cleaning processing of the back surface of the substrate W2 is started by the back surface cleaning processing unit SSR2. Timing at which the substrate W2 is transferred to the back surface cleaning processing unit SSR from the center robot CR is slightly delayed from timing at which the substrate W1 is transferred to the back surface cleaning processing unit SSR from the center robot CR. However, in FIG. 20, to simplify the explanation, the case is illustrated where the substrate W1 and the substrate W2 are transferred to the back surface cleaning processing units SSR from the center robot CR at the same point of time t2.

From the point of time t2 to a point of time t3, the center robot CR is moved to a position which faces the reverse and transfer unit RT2 in an opposed manner. Before the point of time t3 comes, the third substrate W3 is placed on the reverse and transfer unit RT2 by the indexer robot IR, and the third substrate W3 is reversed by the reverse and transfer unit RT2.

At the point of time t3, the third substrate W3 is transferred to the center robot CR from the reverse and transfer unit RT2. From the point of time t3 to a point of time t4, the center robot CR which holds the substrate W3 is moved to a position which faces the back surface cleaning processing unit SSR3 in an opposed manner. At the point of time t4, the substrate W3 is transferred to the back surface cleaning processing unit SSR3 from the center robot CR. Then, the cleaning processing of the back surface of the substrate W3 is started by the back surface cleaning processing unit SSR3.

From the point of time t4 to a point of time t5, the center robot CR is moved to a position which faces the back surface cleaning processing unit SSR1 in an opposed manner. At the point of time t5, the substrate W1 is transferred to the center robot CR from the back surface cleaning processing unit SSR1. Next, after the center robot CR is moved to a position which faces the back surface cleaning processing unit SSR2 in an opposed manner, the substrate W2 is transferred to the center robot CR from the back surface cleaning processing unit SSR2. From the point of time t5 to a point of time t6, the center robot CR which holds the substrates W1, W2 is moved to a position which faces the reverse unit RT1 in an opposed manner. At the point of time t6, the substrates W1, W2 are simultaneously transferred to the reverse unit RT1 from the center robot CR. From the point of time t6 to a point of time t7, the reverse unit RT1 reverses the substrates W1 and W2 simultaneously. At the point of time t7, the substrates W1, W2 are simultaneously transferred to the center robot CR from the reverse unit RT1. From the point of time t7 to a point of time t8, the center robot CR which holds the substrates W1, W2 is moved to a position which faces the front surface cleaning processing unit SS1 in an opposed manner. At the point of time t8, the substrate W1 is transferred to the front surface cleaning processing unit SS1 from the center robot CR. Thereafter, cleaning processing of the front surface of the substrate W1 is started by the front surface cleaning processing unit SS1. The center robot CR is moved to a position which faces the front surface cleaning processing unit SS2 in an opposed manner. Then, the substrate W2 is transferred to the front surface cleaning processing unit SS2 from the center robot CR. Thereafter, cleaning processing of the front surface of the substrate W2 is started by the front surface cleaning processing unit SS2.

From the point of time t8 to a point of time t9, the center robot CR is moved to a position which faces the back surface cleaning processing unit SSR3 in an opposed manner. At the point of time t9, the substrate W3 is transferred to the center robot CR from the back surface cleaning processing unit SSR3. From the point of time t9 to a point of time t10, the center robot CR which holds the substrate W is moved to a position which faces the reverse unit RT1 in an opposed manner. At the point of time t10, the substrate W3 is transferred to the reverse unit RT1 from the center robot CR. From the point of time t10 to a point of time t11, the reverse unit RT1 reverses the substrate W3. At the point of time t11, the substrate W3 is transferred to the center robot CR from the reverse unit RT1. From the point of time t11 to a point of time t12, the center robot CR which holds the substrate W3 is moved to a position which faces the front surface cleaning processing unit SS3 in an opposed manner. At the point of time t12, the substrate W3 is transferred to the front surface cleaning processing unit SS3 from the center robot CR. Thereafter, cleaning processing of the front surface of the substrate W3 is started by the front surface cleaning processing unit SS3.

From the point of time t12 to a point of time t13, the center robot CR is moved to a position which faces the reverse and transfer unit RT2 in an opposed manner. Before a point of time t13 comes, the fourth and fifth substrates W4, W5 are placed on the reverse and transfer unit RT2 by the indexer robot IR and are reversed by the reverse and transfer unit RT2. At the point of time t13, the substrates W4, W5 are simultaneously transferred to the center robot CR from the reverse and transfer unit RT2. From the point of time t13 to a point of time t14, the center robot CR which holds the substrates W4, W5 is moved to a position which faces the back surface cleaning processing unit SSR1 in an opposed manner. At the point of time t14, the substrate W4 is transferred to the back surface cleaning processing unit SSR1 from the center robot CR. Thereafter, cleaning processing of the back surface of the substrate W4 is started by the back surface cleaning processing unit SSR1. The center robot CR is moved to a position which faces the back surface cleaning processing unit SSR2 in an opposed manner. Then, the substrate W5 is transferred to the back surface cleaning processing unit SSR2 from the center robot CR. Thereafter, cleaning processing of the back surface of the substrate W5 is started by the back surface cleaning processing unit SSR2. Timing at which the substrate W5 is transferred to the back surface cleaning processing unit SSR from the center robot CR is slightly delayed from timing at which the substrate W4 is transferred to the back surface cleaning processing unit SSR from the center robot CR. However, in FIG. 20, to simplify the explanation, the case is illustrated where the substrate W4 and the substrate W5 are transferred to the back surface cleaning processing units SSR from the center robot CR at the same point of time t14.

From the point of time t14 to a point of time t15, the center robot CR is moved to a position which faces the reverse and transfer unit RT2 in an opposed manner. Before a point of time t15 comes, the sixth substrate W6 is placed on the reverse and transfer unit RT2 by the indexer robot IR and is reversed by the reverse and transfer unit RT2. At the point of time t15, the sixth substrate W6 is transferred to the center robot CR from the reverse and transfer unit RT2. From the point of time t15 to a point of time t16, the center robot CR which holds the substrate W6 is moved to a position which faces the back surface cleaning processing unit SSR3 in an opposed manner. At the point of time t16, the substrate W6 is transferred to the back surface cleaning processing unit SSR3 from the center robot CR. Thereafter, cleaning processing of the back surface of the substrate W6 is started by the back surface cleaning processing unit SSR3.

From the point of time t16 to a point of time t17, the center robot CR is moved to a position which faces the back surface cleaning processing unit SSR1 in an opposed manner. At the point of time t17, the substrate W4 is transferred to the center robot CR from the back surface cleaning processing unit SSR1. Next, after the center robot CR is moved to a position which faces the back surface cleaning processing unit SSR2 in an opposed manner, the substrate W5 is transferred to the center robot CR from the back surface cleaning processing unit SSR2. From the point of time t17 to a point of time t18, the center robot CR which holds the substrates W4, W5 is moved to a position which faces the reverse unit RT1 in an opposed manner. At the point of time t18, the substrates W4, W5 are simultaneously transferred to the reverse unit RT1 from the center robot CR. From the point of time t18 to a point of time t19, the reverse unit RT1 simultaneously reverses the substrates W4 and W5. The substrates W4, W5 are simultaneously transferred to the center robot CR from the reverse unit RT1 at the point of time t19. From the point of time t19 to a point of time t20, the center robot CR which holds the substrates W4, W5 is moved to a position which faces the front surface cleaning processing unit SS4 in an opposed manner. At the point of time t20, the substrate W4 is transferred to the front surface cleaning processing unit SS4 from the center robot CR. Thereafter, cleaning processing of the front surface of the substrate W4 is started by the front surface cleaning processing unit SS4. The center robot CR is moved to a position which faces the front surface cleaning processing unit SS5 in an opposed manner. Then, the substrate W5 is transferred to the front surface cleaning processing unit SS5 from the center robot CR. Thereafter, cleaning processing of the front surface of the substrate W5 is started by the front surface cleaning processing unit SS5.

From the point of time t20 to a point of time t21, the center robot CR is moved to a position which faces the back surface cleaning processing unit SSR3 in an opposed manner. At the point of time t21, the substrate W6 is transferred to the center robot CR from the back surface cleaning processing unit SSR3. From the point of time t21 to a point of time t22, the center robot CR which holds the substrate W6 is moved to a position which faces the reverse unit RT1 in an opposed manner. At the point of time t2, the substrate W6 is transferred to the reverse unit RT1 from the center robot CR. From the point of time t22 to a point of time t23, the reverse unit RT1 reverses the substrate W6. At the point of time t23, the substrate W6 is transferred to the center robot CR from the reverse unit RT1. From the point of time t23 to a point of time t24, the center robot CR which holds the substrate W6 is moved to a position which faces the front surface cleaning processing unit SS6 in an opposed manner. At the point of time t24, the substrate W6 is transferred to the front surface cleaning processing unit SS6 from the center robot CR. Thereafter, cleaning processing of the front surface of the substrate W6 is started by the front surface cleaning processing unit SS6.

In this manner, the center robot CR conveys the substrates W toward the back surface cleaning part 12 (segment S5) where three back surface cleaning processing units SSR perform parallel processing from the reverse and transfer unit RT2 (segment S1) with a rhythm of two pieces→one piece→two pieces→one piece . . . .

In the same manner, the center robot CR conveys the substrates W toward the reverse unit RT1 (segment S7) from the back surface cleaning processing part 12 with a rhythm of 2 pieces→1 piece→2 pieces→1 piece . . . . The center robot CR conveys the substrates W toward the front surface cleaning part 11 (segment S9) where six front surface cleaning processing units SS perform parallel processing from the reverse unit RT1 with a rhythm of two pieces→one piece→two pieces→one piece . . . .

<3.4 Generalization of Present Invention>

Hereinafter, the content of the present invention is generalized. It is an object of the present invention to perform the transfer of the substrates W rhythmically by the substrate conveyance part (indexer robot IR or the center robot CR) capable of simultaneously conveying of a plurality pieces of substrates (N pieces, N being not a divisor of M) toward one or more segments (carrier C, reverse unit RT1, reverse and transfer unit RT2, the front surface cleaning processing part 11 having the plurality of surface cleaning processing units SS capable of performing parallel processing, the back surface cleaning processing part 12 having the plurality of back surface cleaning processing units SSR capable of performing parallel processing or the like) which can hold a plurality of (M pieces of) substrates W or capable of conveying out such substrates from the segment.

Firstly, the substrate conveyance processing by the substrate conveyance part toward one segment or from one segment is focused. When M is completely divided by N, the simultaneous conveyance of N piece of substrates W is repeatedly performed. When M is not divided by N, variables i1, i2, . . . iN which satisfy the following formula 3 are set. Then, the operation schedule of the substrate conveyance part is set by referencing the formula 1 into which the variables i1, i2, . . . iN are substituted.

$$M = N \times i1 + (N-1) \times i2 + (N-2) \times i3 + \ldots + 1 \times iN \quad \text{formula 3}$$

wherein all of i1, i2, i3, . . . iN are arbitrary integers of 0 or more and not more than (MN).

That is, a substrate conveyance cycle constituted of the following first step, second step, third step, . . . and Nth step is performed repeatedly.

[First step] Substrate conveyance step where N pieces of substrates W are simultaneously conveyed from one segment or toward such one segment by the substrate conveyance part is performed i1 times.

[Second step] Substrate conveyance step where (N−1) pieces of substrates W are simultaneously conveyed from one segment or toward such one segment by the substrate conveyance part is performed i2 times.

[Third step] Substrate conveyance step where (N−2) pieces of substrates W are simultaneously conveyed from one segment or toward such one segment by the substrate conveyance part is performed i3 times.

[Nth step] Substrate conveyance step where 1 piece of substrate W is simultaneously conveyed from one segment or toward such one segment by the substrate conveyance part is performed iN times.

The substrate conveyance cycle is not limited to the mode where the first step to the Nth step are performed in this order, and for example, the first step to the Nth step may be performed in an arbitrary order. Further, the substrate conveyance cycle is not limited to the mode where the first step to the Nth step are sequentially performed in an arbitrary order and, for example, at least a part of two or more steps out of the first step to the Nth step may be performed in parallel.

In other words, the following substrate conveyance cycle is performed repeatedly by the substrate conveyance part capable of simultaneously conveying N pieces (N being an integer of 2 or more which is not a devisor of M) of substances W from one segment capable of simultaneously holding M pieces (M being an integer of 2 or more) of substrates W or toward such one segment. Here, N pieces of variables ik (k being integers of 1 to N) are each arbitrary integers of 0 or more and not more than (MN) and satisfy the following formula 1. In the substrate conveyance cycle, the conveyance step where the substrate conveyance step of simultaneously conveying (N−k−1) pieces of substrates W from one segment or toward one segment by the substrate conveyance part is performed ik times is performed with respect to the conveyance step where the number of times of substrate conveyance steps is defined by each variable which is a natural number out of N pieces of variables ik.

$$M = \sum_{k=1}^{N} \{(N-k+1) \times ik\} \quad \text{(Formula 1)}$$

When i1 is the natural number, the substrate conveyance cycle includes the conveyance step where the substrate conveyance step of simultaneously conveying N pieces of substrates from one segment or toward one segment by the substrate conveyance part is performed i1 times. A throughput in the substrate processing apparatus is enhanced due to such a substrate conveyance cycle.

Here, the processing is explained specifically by taking the case where three substrates are simultaneously conveyed in accordance with "back 10 parallel" (M=10, N=3).

In this case, as the combination of the variables i1, i2, i3, . . . iN which satisfy the formula 1 and the formula 3, the following combination can be exemplified.

$10 = 3 \times 3 + 2 \times 0 + 1 \times 1$ (Here, $i1=3$, $i2=0$, $iN=1$)   [1]

$10 = 3 \times 2 + 2 \times 2 + 1 \times 0$ (Here $i1=2$, $i2=2$, $iN=0$)   [2]

$10 = 3 \times 2 + 2 \times 1 + 1 \times 2$ (Here, $i1=2$, $i2=1$, $iN=2$)   [3]

$10 = 3 \times 2 + 2 \times 0 + 1 \times 4$ (Here, $i1=2$, $i2=0$, $iN=4$)   [4]

$10 = 3 \times 1 + 2 \times 3 + 1 \times 1$ (Here, $i1=1$, $i2=3$, $iN=1$)   [5]

[1] corresponds to the above-mentioned plan logic 1, and is the operation schedule where the substrates W are conveyed by repeating the cycle where the simultaneous conveyance of three pieces of substrates is repeated three times and, thereafter, the cycle of conveying one piece of substrate is performed one time. [2] is the operation schedule where the substrates W are conveyed by repeating the cycle where the simultaneous conveyance of three pieces of substrates is repeated two times and, thereafter, the simultaneous conveyance of two pieces of substrates is repeatedly performed two times. [3] is the operation schedule where the conveyance of the substrates W is performed by repeating the cycle where the simultaneous conveyance of three pieces of substrates is repeated two times and, thereafter, the simultaneous conveyance of two pieces of substrates is performed one time, and the conveyance of one piece is performed repeatedly two times. [4] is the operation schedule where the substrates W are conveyed by repeating the cycle where the simultaneous conveyance of three pieces of substrates is performed repeatedly two times and, thereafter, the conveyance of one piece of substrate is performed four times. [5] is the operation schedule where the substrates W are conveyed by repeating the cycle where the simultaneous conveyance of three pieces of substrates is performed one time and, thereafter, the simultaneous conveyance of two substrates is performed three times, and the conveyance of one piece of substrate is performed one time. In all cases [1] to [5], the conveyance of M pieces of substrates W by using the substrate conveyance part toward the segment or from the segment by the substrate conveyance part is performed during a period that the substrate conveyance part completes the substrate conveyance cycle one time.

Next, the substrate conveyance processing is considered where the substrate conveyance part conveys the substrates W in order between a plurality of segments (the first segment R1 capable of simultaneously holding M1 pieces of substrates and the second segment R2 capable of simultaneously holding M2 pieces of substrates W). Firstly, when neither M1 pieces nor M2 pieces is divided by N, M3 which is the greatest divisor of M1 and M2 is obtained. Then, variables i1, i2, . . . iN which satisfy the following formula 4 are set. Then, the operation schedule of the substrate conveyance part is set by referencing the formula 4 in which the variables i1, i2, . . . iN are substituted.

$$M3 = N \times i1 + (N-1) \times i2 + (N-2) \times i3 + \ldots + 1 \times iN \quad \text{formula 4}$$

(wherein all of i1, i2, i3, . . . iN are arbitrary integers of 0 or more and not more than (M/N)).

Here, the method uses the first segment, the second segment and the substrate conveyance part which conveys the substrates W to the first segment and the second segment in order, and can hold a plurality of (N pieces, N being not a divisor of at least one of M1 and M2 ) substrates W.

That is, a substrate conveyance cycle constituted of the following first step, second step, third step, . . . and Nth step is performed repeatedly.

[First step] Substrate conveyance where N pieces of substrates W are simultaneously conveyed in the first segment and, next, N pieces of substrates W are simultaneously conveyed out from the first segment and, then, N pieces of substrates W are simultaneously conveyed in the second segment is performed i1 times.

[Second step] Substrate conveyance where (N−1) pieces of substrates W are simultaneously conveyed in the first segment and, next, (N−1) pieces of substrates W are simultaneously conveyed out from the first segment and, then, (N−1) pieces of substrates W are simultaneously conveyed in the second segment is performed i2 times.

[Third step] Substrate conveyance where (N−2) pieces of substrates W are simultaneously conveyed in the first segment and, next, (N−2) pieces of substrates W are simultaneously conveyed out from the first segment and, then, (N−2) pieces of substrates W are simultaneously conveyed in the second segment is performed i3 times.

[Nth step] Substrate conveyance where 1 piece of substrate W is simultaneously conveyed in the first segment and, next, 1 piece of substrate W is simultaneously conveyed out from the first segment, and, then, one piece of substrate W is simultaneously conveyed in the second segment is performed iN times.

The substrate conveyance cycle is not limited to the mode where the first step to the Nth step are performed in this order, and for example, the first step to the Nth step may be performed in an arbitrary order. Further, the substrate conveyance cycle is not limited to the mode where the first step to the Nth step are sequentially performed in an arbitrary order and, for example, at least a part of two or more steps out of the first step to the Nth step may be performed in parallel.

In other words, the following substrate conveyance cycle is performed repeatedly by the first segment capable of simultaneously holding M1 pieces (M1 being an integer of 2 or more) of substrates, the second segment capable of simultaneously holding M2 pieces (M2 being an integer of 2 or more) of substrates W, and the substrate conveyance part capable of simultaneously conveying the substrates to the first segment and the second segment in order and also capable of holding N pieces of (N being an integer of 2 or more which is not a devisor of at least one of M1 and M2 ) of substrate W. Here, the greatest devisor of M1 and M2 is M3 , and N pieces of variables ik (k being integers of 1 to N) are respectively arbitrary integers of 0 or more and not more than (M3 /N) and satisfy the following formula 2. In the substrate conveyance cycle, the conveyance step where the substrate conveyance step of simultaneously conveying (N−k−1) pieces of substrates W toward the first segment, simultaneously conveying (N−k−1) pieces of substrates W from the first segment, and simultaneously conveying (N−k−1) pieces of substrates W toward the second segment is performed ik times is performed with respect to the conveyance step where the number of times of substrate conveyance steps is defined by each variable which is a natural number out of N pieces of variables ik.

$$M3 = \sum_{k=1}^{N} \{(N-k+1) \times ik\} \quad \text{(Formula 2)}$$

When i1 is the natural number, the substrate conveyance cycle includes the conveyance step where the substrate conveyance step where the operation of simultaneously conveying N pieces of substrates to the first segment, the operation of conveying out the N pieces of substrates from the first segment; and the operation of simultaneously conveying N pieces of substrates to the second segment are sequentially performed is performed i1 times by the substrate conveyance part. A throughput in the substrate processing apparatus is enhanced due to such a substrate conveyance cycle.

Here, the processing is explained specifically by taking the case where two substrates are simultaneously conveyed in accordance with "back 3 parallel-front 6 parallel" (M1=3, M2=6, and N=2).

In this case, the greatest divisor of M1 and M2 becomes "3". Accordingly, the combination of i1 and i2 which satisfies the formula 2 and formula 4 is i1=1 and i2=1 and hence, the following formula is obtained.

$$3 = 2 \times 1 + 1 \times 1 \quad [6]$$

[6] corresponds to the previously-mentioned plan logic 2 where a plurality of substrates W are sequentially conveyed to the first segment R1 by repeating the cycle where the simultaneous conveyance of two pieces of substrates is performed 1 time and, thereafter, the conveyance of one piece of substrate is performed one time and, next, the substrates conveyed out from the first segment are conveyed to the second segment R2. In this case, the rhythmic conveyance can be realized.

In the first preferred embodiment, the explanation has been made by focusing on the transfer of the substrates W between the center robot CR and the relay part 50, the front surface cleaning processing part 11 and the back surface cleaning processing part 12. However, the present invention is also applicable to the case where the indexer robot IR transfers the substrates W to the carrier C or the relay part 50. Further, although the operation schedules and the schedule data SD of the indexer robot IR and the center robot CR are prepared by the schedule preparation program P1 in the first preferred embodiment, these may be prepared by a control circuit which has the same functions as the schedule preparation program P1.

Although the explanation has been made with respect to the constitution where the schedule is prepared by using the scrub cleaning processing apparatus as the substrate processing apparatus 1 in the first preferred embodiment, the substrate processing apparatus 1 is not limited to the scrub cleaning processing apparatus, and the present invention is applicable to various substrate processing apparatuses such as a sheet-type substrate cleaning device to which brush cleaning is not applied, a cooling processing apparatus or a drying processing apparatus.

While the invention has been shown and described in detail, the foregoing description is in all aspects illustrative and not restrictive. It is therefore understood that numerous modifications and variations can be devised without departing from the scope of the invention.

What is claimed is:

1. A substrate conveyance method, for a system including a segment capable of simultaneously holding M substrates, where M is an integer equal or greater than, and a substrate conveyance part capable of simultaneously conveying from the segment or toward the segment, N of said substrates, where N is an integer equal or greater than 2 and N is not a divisor of said integer M, wherein the substrate conveyance method comprises:

repeatedly performing the step of:
simultaneously conveying, when N pieces of variables ik defined by integers k of 1 to N are arbitrary integers of 0 or more and not more than (M/N) and satisfy a following formula 1, $$M = \sum_{k=1}^{N} [(N-k+1) \times ik]$$ (Formula 1)

(N−k−1) of said substrates ik times, where the number of times of said conveying steps is defined by each variable which is a natural number out of said N of said variables ik.

2. The substrate conveyance method according to claim 1, wherein said ik is a natural number.

3. The substrate conveyance method according to claim 1, wherein said segment is a substrate processing part provided with a plurality of substrate processing units, each of said substrate processing units holds and processes one piece of said substrate for each substrate processing unit, and said substrate conveyance cycle is repeatedly performed based on said formula 1 when the number of said substrate processing units capable of performing processing in parallel in said substrate processing part is said M.

4. The substrate conveyance method according to claim 3, wherein said substrate conveyance cycle includes the steps of: a step of performing a substrate conveyance step of simultaneously conveying said N pieces of substrates from said substrate processing part or toward the substrate processing part the number of times which agrees with a quotient of an integer obtained by division where said integer M is divided by said integer N; and a step of performing a substrate conveyance step of simultaneously conveying said substrates of the number which agrees with the number of remainders obtained by dividing said integer M by said integer N from said substrate processing part or toward said substrate processing part one time.

5. The substrate conveyance method according to claim 1, wherein said integer M is decided based on a flow recipe which designates regions where said substrate is to be held in said segment.

6. A substrate conveyance method, for a system which uses: a first segment capable of simultaneously holing M1 substrates, where M1 is an integer equal or greater than 2; a second segment capable of simultaneously holding M2 substrates, where M2 is an integer equal or greater than 2; and a substrate conveyance part capable of sequentially conveying the substrates to said first segment and to said second segment and also capable of holding N of said substrates, where N is an integer equal or greater than 2 and is not a divisor of at least one of said M1 and said M2 integers, wherein the substrate conveyance method comprises:
repeatedly performing, when the greatest common divisor of said integer M1 and said integer M2 is an integer M3, and variables ik defined by integers k of 1 to N are arbitrary integers of 0 or more and not more than (M3/N) and satisfy a following formula 2, $$M3 = \sum_{k=1}^{N} [(N-k+1) \times ik]$$ (Formula 2)

the steps of (a) simultaneously conveying (N−k−1) pieces of said substrates toward said first segment, (b) conveying out said (N−k−1) pieces of substrates from said first segment, and (c) simultaneously conveying said (N−k−1) pieces of substrates toward said second segment, said (a) to (c) steps are sequentially executed ik times, where the number of times of a sequence of said (a) to (c) steps is defined by each variable which is a natural number out of said N of said variables ik.

7. The substrate conveyance method according to claim 6, wherein said ik is a natural number.

8. The substrate conveyance method according to claim 6, wherein said first segment is a first substrate processing part provided with a plurality of first substrate processing units, each of said first substrate processing units holds and processes one piece of substrate for each first substrate processing unit, said second segment is a second substrate processing part provided with a plurality of second substrate processing units, each of said second substrate processing units holds and processes one piece of substrate for each second substrate processing unit, and said substrate conveyance cycle is repeatedly performed based on said formula 2 when the number of said first substrate processing units capable of performing processing in parallel in said first substrate processing part is said integer M1, and the number of said second substrate processing units capable of performing processing in parallel in said second substrate processing part is said integer M2.

9. The substrate conveyance method according to claim 7, wherein said substrate conveyance cycle includes the steps of: a step of performing the substrate conveyance step of sequentially performing an operation of simultaneously conveying said N pieces of substrates toward said first segment, an operation of conveying said N pieces of substrates from said first segment and simultaneously conveying said N pieces of substrates toward said second segment the number of times which agrees with a quotient of an integer obtained by dividing said integer M3 by said integer N; and a step where the substrate conveyance step where the substrates of the number which agrees with a remainder obtained by dividing said integer M3 by said integer N are simultaneously conveyed toward said first segment and, subsequently, are conveyed from said first segment and are simultaneously conveyed toward said second segment is performed one time.

10. The substrate conveyance method according to claim 6, wherein the integer M1 and said integer M2 are decided based on a flow recipe which designates regions where said substrate is to be held in said first segment and said second segment.

11. A substrate processing apparatus comprising: a segment which simultaneously holds M pieces of substrates defined by an integer M of 2 or more; a substrate conveyance part which is capable of simultaneously conveying N pieces of substrates defined by an integer N of 2 or more which is not a divisor of said integer M from said segment or toward said segment; and a control part which makes said substrate conveyance part repeatedly perform a substrate conveyance cycle where a substrate conveyance step of simultaneously conveying (N−k−1) pieces of substrates from said segment or toward the segment is performed ik times with respect to said conveyance step where the number of times of said substrate conveyance steps is defined by each variable which is a natural number out of said N pieces of variables ik when N pieces of variables ik defined by integers k of 1 to N are arbitrary integers of 0 or more and not more than (M/N) and satisfy a following formula 1, $$M = \sum_{k=1}^{N} [(N-k+1) \times ik].$$ (Formula 1)

12. A substrate processing apparatus comprising: a first segment which simultaneously holds M1 pieces of substrates defined by an integer M1 of 2 or more; a second segment which simultaneously holds M2 pieces of substrates defined by an integer of M2 of 2 or more; a substrate conveyance part capable of sequentially conveying the substrates to said first segment and said second segment and also capable of holding N pieces of substrates defined by an integer N of 2 or more which is not a divisor of at least one of said integer M1 and said integer M2, and a control part which makes said substrate conveyance part to repeatedly execute a substrate conveyance cycle where a conveyance step in which a substrate conveyance step where an operation of simultaneously conveying said (N−k−1) pieces of substrates toward said first segment, an operation of conveying out said (N−k−1) pieces of substrates from said first segment, and an operation of simultaneously conveying said (N−k−1) pieces of substrates toward said second segment are sequentially performed is performed ik times is performed with respect to said conveyance step where the number of times of said substrate conveyance steps is defined by each variable which is a natural number out of said N pieces of variables ik assuming that the greatest common divisor of said integer M1 and said integer M2 is an integer M3, and N pieces of variables ik defined by integers k of 1 to N are arbitrary integers of 0 or above and not more than (M3/N) and satisfy a following formula 2, $$M3 = \sum_{k=1}^{N} [(N-k+1) \times ik].$$ (Formula 2)

* * * * *